United States Patent
Liu

(10) Patent No.: US 9,674,619 B2
(45) Date of Patent: Jun. 6, 2017

(54) MEMS MICROPHONE AND FORMING METHOD THEREFOR

(75) Inventor: Lianjun Liu, Tianjin (CN)

(73) Assignee: MEMSEN ELECTRONICS INC, Tianjin (CN)

( * ) Notice: Subject to any disclaimer, the term of this patent is extended or adjusted under 35 U.S.C. 154(b) by 32 days.

(21) Appl. No.: 14/004,822

(22) PCT Filed: Feb. 22, 2012

(86) PCT No.: PCT/CN2012/071441
§ 371 (c)(1),
(2), (4) Date: Sep. 12, 2013

(87) PCT Pub. No.: WO2012/122871
PCT Pub. Date: Sep. 20, 2012

(65) Prior Publication Data
US 2014/0003633 A1   Jan. 2, 2014

(30) Foreign Application Priority Data
Mar. 15, 2011   (CN) .......................... 2011 1 0061561

(51) Int. Cl.
*H04R 25/00*   (2006.01)
*H04R 23/00*   (2006.01)
(Continued)

(52) U.S. Cl.
CPC ............... *H04R 23/00* (2013.01); *H04R 1/04* (2013.01); *H04R 31/00* (2013.01);
(Continued)

(58) Field of Classification Search
USPC ................................................. 381/175, 369
See application file for complete search history.

(56) References Cited

U.S. PATENT DOCUMENTS

2003/0021432 A1* 1/2003 Scheeper ............... H04R 19/04
                                                         381/174
2007/0041597 A1* 2/2007 Song ..................... B81C 1/0023
                                                         381/175
(Continued)

FOREIGN PATENT DOCUMENTS

CN          101296531 A       10/2008
CN          101808262 A        8/2010
(Continued)

OTHER PUBLICATIONS

International Search Report for International Application No. PCT/CN2012/071441; Date of Mailing: May 31, 2012, with English Translation.
(Continued)

*Primary Examiner* — Amir Etesam
(74) *Attorney, Agent, or Firm* — Cantor Colburn LLP

(57) ABSTRACT

A micro-electro-mechanical system (MEMS) microphone and a forming method therefore. The MEMS microphone comprises: a first substrate, the first substrate is provided with a first bonding face, the first substrate comprises an MEMS microphone component and a first conductive bonding structure arranged on the first bonding face, a second substrate, the second substrate is provided with a second bonding face, the second bonding substrate comprises a circuit and a second conductive bonding structure arranged on the second bonding face; the first substrate and the second substrate are oppositely fitted together via the first conductive bonding structure and the second conductive bonding structure. Embodiments of the present invention have a simple packaging technique and a compact size; the MEMS microphone packaging structure formed has a great performance on signal-to-noise ratio, and a great anti-interference capability.

20 Claims, 17 Drawing Sheets

(51) Int. Cl.
*H04R 1/04* (2006.01)
*H04R 31/00* (2006.01)

(52) U.S. Cl.
CPC ............ *H01L 2224/48091* (2013.01); *H01L 2224/48137* (2013.01); *H04R 2201/003* (2013.01); *H04R 2201/029* (2013.01)

(56) References Cited

U.S. PATENT DOCUMENTS

| | | | | |
|---|---|---|---|---|
| 2009/0185700 | A1* | 7/2009 | Suzuki | H04R 19/005 381/174 |
| 2010/0002895 | A1* | 1/2010 | Notake | B81B 3/0051 381/174 |
| 2010/0158281 | A1* | 6/2010 | Lee | B81C 1/00182 381/175 |
| 2010/0183174 | A1* | 7/2010 | Suvanto | H04R 19/005 381/174 |
| 2010/0193884 | A1* | 8/2010 | Park | B81C 1/00269 257/414 |

FOREIGN PATENT DOCUMENTS

| | | |
|---|---|---|
| CN | 102158787 A | 8/2011 |
| CN | 102158789 A | 8/2011 |

OTHER PUBLICATIONS

Dehe, Alfons, "Silicon microphone development and application" Sensors and Actuators A 133 (2007) 283-287, 5 pages.

* cited by examiner providing a first substrate having a first surface and a second surface opposite to the first surface; forming a sensitive diaphragm and a dielectric layer by which the sensitive diaphragm is covered being formed on the first surface of the first substrate; forming a first top-layer electrode and a fixed electrode which is corresponding to the sensitive diaphragm on a surface of the dielectric layer, and forming the fixed electrode having a plurality of through holes running through the fixed electrode — S101 providing a second substrate within which a circuit is formed, with the second substrate having a third surface and a fourth surface, and forming a second top-layer electrode, corresponding to the first top-layer electrode, on the third surface of the second substrate — S102 bonding the top-layer electrode to the second-layer electrode — S103 removing a part of the first substrate from the second surface to form a first opening — S104 removing a part of the second substrate to form a second opening — S105 removing the dielectric layer corresponding to the sensitive diaphragm, so that a variable capacitor is formed between the sensitive diaphragm and the fixed electrode, and the capacitance of the variable capacitor changes under the stimulus of an acoustic signal — S106

Fig.3

MEMS MICROPHONE AND FORMING METHOD THEREFOR

This is the US national stage of application No. PCT/CN2012/071441 filed on Feb. 22, 2012. Priority under 35 U.S.C. §119(a) and 35 U.S.C. §365(b) is claimed from Chinese Application No. 201110061561.9, filed on Mar. 15, 2011, the disclosure of which is incorporated herein by reference in its entirety.

FIELD OF THE INVENTION

The present invention relates to the field of micro-electromechanical system process, and particularly to a Micro-Electro-Mechanical Systems (MEMS) microphone and a forming method therefore.

BACKGROUND OF THE INVENTION

A Micro-Electro-Mechanical System (MEMS) microphone formed by a micro electronic mechanical system process has become one of the best candidates for replacing an Electret Condenser Microphone (ECM) with organic film, due to its characteristics of miniaturization and light-weight of the MEMS microphone.

The MEMS microphone is a miniature microphone made by etching a pressure sensing diaphragm on a semiconductor using micro-electro-mechanical system process, and is widely used in mobile phone, headset, notebook computer, video camera and car. Driven by the need of MEMS microphone's compatibility with Complementary Metal Oxide Semiconductor (CMOS) and further reducing the size of the MEMS microphone, package structure for MEMS microphone has attracted many development activities in recent years. Many companies invest a lot of money and scientific manpower to study the package structure for MEMS microphone. However, a method adopted by all these companies is that a CMOS circuit and a MEMS microphone are manufactured separately, then the CMOS circuit and MEMS microphone are attached on a substrate, and finally, the CMOS circuit is coupled to the MEMS microphone by wire-bonding technology.

A package structure for the MEMS microphone is given in a paper of "Silicon microphone development and application", Sensors and Actuators A, 2007, 133: 283-287. Referring to FIG. 1, the package structure includes a package substrate 100, which has an opening in communication with the package substrate 100, with the opening being adapted to pass through an acoustic signal; a MEMS microphone 110 and a CMOS circuit 120 adapted to control the MEMS microphone 110 which are located respectively on the package substrate 100; a wire 140 electrically coupling the MEMS microphone 110 to the CMOS circuit 120; and a package frame 130 by which the package substrate 100, the MEMS microphone 110 and the CMOS circuit 120 are covered. The CMOS circuit 120 and the MEMS microphone 110 are manufactured separately, and then are packaged on the package substrate 100 by the wire-bonding technology. The package structure for the MEMS microphone packaged on the package substrate 100 by wire-bonding technology has a large size, and needs an additional package frame 130, which has a complex manufacturing and packaging process, a large size, and high cost.

SUMMARY OF THE INVENTION

A problem to be solved in an embodiment of the present invention is to provide a MEMS microphone and a forming method therefore, which have a simple manufacturing and packaging process, a small size, good signal-to-noise ratio performance, and high interference immunity.

To solve the problem described above, a MEMS microphone is provided according to an embodiment of the present invention, and the MEMS microphone includes:

a first base-structure having a first bonding surface and including a MEMS microphone component and a first conductive bonding structure having the first bonding surface; and a second base-structure having a second bonding surface and including a circuit and a second conductive bonding structure, with the second conductive bonding structure having the second bonding surface;

wherein the first base-structure is bonded correspondingly to the second base-structure via the first conductive bonding structure and the second conductive bonding structure.

Alternatively, the MEMS microphone component may include a sensitive diaphragm and a fixed electrode corresponding to the sensitive diaphragm.

Alternatively, the MEMS microphone may further include: a first structure located in the first base-structure, wherein the first structure is a first opening or a first air cavity.

Alternatively, the sensitive diaphragm or the fixed electrode may be exposed through the first opening.

Alternatively, the MEMS microphone may further include: a second structure located in the second base-structure, wherein the second structure is a second opening or a second air cavity.

Alternatively, the sensitive diaphragm or the fixed electrode may be exposed through the second opening.

Alternatively, the first structure may be in communication with the second structure.

Alternatively, the first conductive bonding structure may include a first top-layer electrode and a bonding layer located on a surface of the first top-layer electrode.

Alternatively, the first top-layer electrode is located in the same layer as the fixed electrode or the sensitive diaphragm, and is made from the same material as the fixed electrode or the sensitive diaphragm.

Alternatively, the MEMS microphone may further include: a bonding pad located on the first bonding surface and a third opening through which the bonding pad located on the first bonding surface is exposed.

Alternatively, the MEMS microphone may further include: a bonding pad located on the second bonding surface and a fourth opening through which the bonding pad located on the second bonding surface is exposed.

Alternatively, the MEMS microphone component may further include a travel stopper which is adapted to prevent stiction between the sensitive diaphragm and the fixed electrode.

Alternatively, the sensitive diaphragm may be made from polycrystalline silicon material.

A method for forming a MEMS microphone is further provided according to the embodiment of the present invention, and the method includes:

providing a first base-structure, which has a first bonding surface and includes a MEMS microphone component and a first conductive bonding structure having the first bonding surface;

providing a second base-structure, which has a second bonding surface and includes a circuit and a second conductive bonding structure having the second bonding surface; and bonding correspondingly the first base-structure to the second base-structure via the first conductive bonding structure and the second conductive bonding structure.

Alternatively, the MEMS microphone component may include a sensitive diaphragm and a fixed electrode corresponding to the sensitive diaphragm.

Alternatively, the method for forming the MEMS microphone may further include:

forming a first structure located in the first base-structure, wherein the first structure is a first opening or a first air cavity.

Alternatively, the method for forming the MEMS microphone may further include: forming a second structure located in the second base-structure, wherein the second structure is a second opening or a second air cavity.

Alternatively, the method for forming the MEMS microphone may further include: communicating the first structure with the second structure.

Alternatively, the method for forming the MEMS microphone may further include: forming a bonding pad on the first bonding surface of the first base-structure; and forming a third opening through which the bonding pad located on the first bonding surface is exposed.

Alternatively, the method for forming the MEMS microphone may further include: forming a bonding pad on the second bonding surface of the second base-structure; and forming a fourth opening through which the bonding pad located on the second bonding surface is exposed.

Alternatively, the first conductive bonding structure may include a first top-layer electrode and a bonding layer located on a surface of the first top-layer electrode.

Alternatively, the MEMS microphone component may include a sensitive diaphragm and a fixed electrode corresponding to the sensitive diaphragm, and the first top-layer electrode is formed in the same process step as the fixed electrode or the sensitive diaphragm.

The embodiment of the present invention has the following advantages as compared with the prior art. In the MEMS microphone and the forming method therefore according to the embodiment of the present invention, the first base-structure is bonded to the second base-structure via the first conductive bonding structure and the second conductive bonding structure, specifically, the second base-structure within which a circuit is formed is bonded correspondingly to the first base-structure within which a MEMS microphone is formed via the first conductive bonding structure and the second conductive bonding structure. The MEMS microphone formed in the embodiment of the present invention has a small size and high performance. The MEMS microphone and the forming method therefore according to the embodiment of the present invention has a simple manufacturing and packaging process, a small size, good signal-to-noise ratio performance, and high interference immunity.

BRIEF DESCRIPTION OF THE DRAWINGS

FIG. 3 is a schematic flowchart of a method for forming a MEMS microphone according to a first embodiment of the present invention;

DETAILED DESCRIPTION OF THE INVENTION

It has been found by the inventor of the present invention that the existing MEMS microphone is formed in such a method that a CMOS circuit and a MEMS microphone are manufactured separately and then are packaged on a package substrate by wire-bonding technology, which has a complex manufacturing and packaging process, a large size, and high cost.

Figure 1:
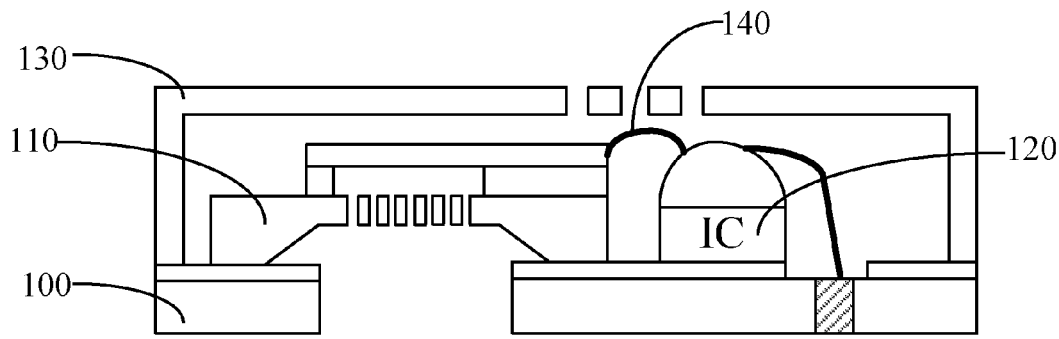
FIG. 1 is a schematic diagram of a package structure for a MEMS microphone in the prior art.
Figure 2:
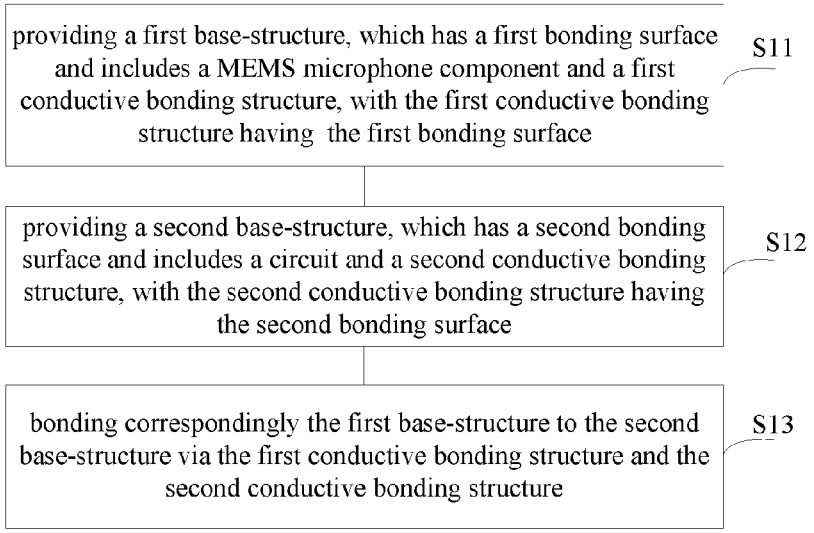
FIG. 2 is a schematic flowchart of a method for forming a MEMS microphone according to an embodiment of the present invention.

To this end, a preferred method for forming a MEMS microphone is proposed by the inventor of the present invention, referring to FIG. 2, and the method includes the following steps S11 to S13.

Step S11, providing a first base-structure, which has a first bonding surface and includes a MEMS microphone component and a first conductive bonding structure, with the first conductive bonding structure having the first bonding surface.

Step S12, providing a second base-structure, which has a second bonding surface and includes a circuit and a second conductive bonding structure, with the second conductive bonding structure having the second bonding surface.

Step S13, bonding correspondingly the first base-structure to the second base-structure via the first conductive bonding structure and the second conductive bonding structure.

A MEMS microphone formed by the forming method described above includes:

a first base-structure having a first bonding surface and including a MEMS microphone component and a first conductive bonding structure having the first bonding surface; and a second base-structure having a second bonding surface and including a circuit and a second conductive bonding structure having the second bonding surface;

wherein the first base-structure is bonded correspondingly to the second base-structure via the first conductive bonding structure and the second conductive bonding structure.

Specifically, the MEMS microphone component includes a sensitive diaphragm and a fixed electrode corresponding to the sensitive diaphragm, and further includes a travel stopper which is adapted to prevent the stiction between the sensitive diaphragm and the fixed electrode. It should also be noted that the MEMS microphone component in the present invention is not limited to the MEMS microphone component exemplified in this embodiment. The existing MEMS microphone components, such as a microphone having a sensitive diaphragm and a fixed electrode corresponding to the sensitive diaphragm, and a microphone having a travel stopper will all fall within the scope of protection of the technical solution of the present invention.

The MEMS microphone described above further includes: a first structure located in the first base-structure, wherein the first structure includes a first opening or a first air cavity. The sensitive diaphragm or the fixed electrode is exposed through the first opening.

The MEMS microphone further includes: a second structure located in the second base-structure, wherein the second structure includes a second opening or a second air cavity. The sensitive diaphragm or the fixed electrode is exposed through the second opening.

In order to illuminate the spirit and essential of the present invention better, the embodiment of the present invention will be further described in detail in conjunction with the drawings and the embodiments below.

First Embodiment

A preferred method for forming a MEMS microphone is proposed by the inventor of the present invention, referring to FIG. 3, and the method includes the following steps S101 to S106.

Step S101, providing a first substrate having a first surface and a second surface opposite to the first surface; forming a sensitive diaphragm and a dielectric layer by which the sensitive diaphragm is covered being formed on the first surface of the first substrate; forming a first top-layer electrode and a fixed electrode which is corresponding to the sensitive diaphragm on a surface of the dielectric layer, and forming the fixed electrode having a plurality of through holes running through the fixed electrode.

Step S102, providing a second substrate within which a circuit is formed, with the second substrate having a third surface and a fourth surface, and forming a second top-layer electrode, corresponding to the first top-layer electrode, on the third surface of the second substrate.

Step S103, bonding the top-layer electrode to the second-layer electrode.

Step S104, removing a part of the first substrate from the second surface to form a first opening.

Step S105, removing a part of the second substrate to form a second opening.

Step S106, removing the dielectric layer corresponding to the sensitive diaphragm, so that a variable capacitor is formed between the sensitive diaphragm and the fixed electrode, and the capacitance of the variable capacitor changes under the stimulus of an acoustic signal.

Alternatively, after step S106 is carried out, the first opening may be further communicated with the second opening to form an air cavity.

It should be noted that in the MEMS microphone according to this embodiment, the first opening may be not communicated with the second opening. Whether or not the first opening is communicated with the second opening in the MEMS microphone according to this embodiment can be selected by those skilled in the art depending on the actual need. It should be noted specifically here that the scope of protection of the present invention should not be limited excessively.

Alternatively, the method for forming the MEMS microphone according to the first embodiment further includes a step of forming a travel stopper which is adapted to prevent stiction between the sensitive diaphragm and the fixed electrode.

Specifically, the first top-layer electrode may be a single layer structure or a multilayer stack structure, and the second top-layer electrode may be a single layer structure or a multilayer stack structure.

In an embodiment of the present invention, the first top-layer electrode may be a conductor, such as aluminum, gold, silicon, germanium, copper, or an alloy of one or more thereof. The second top-layer electrode may be a conductor, such as aluminum, gold, silicon, germanium, copper, or an alloy of one or more thereof. The first base-structure within which a MEMS microphone is formed is bonded correspondingly to the second base-structure having a circuit via the first top-layer electrode and the second top-layer electrode, specifically via eutectic bonding of the first top-layer electrode made from a metal or an alloy and the second top-layer electrode made from a metal or an alloy. Specifically, the first base-structure includes the first substrate and the sensitive diaphragm and the fixed electrode formed on the first substrate. The second base-structure includes the second substrate having a circuit and the second top-layer electrode. The first top-layer electrode is a first conductive bonding structure, and the second top-layer electrode is a second conductive bonding structure.

In another embodiment of the present invention, the first top-layer electrode includes a polycrystalline silicon electrode layer formed on the surface of the dielectric layer and an adhesion layer located on a surface of the polycrystalline silicon electrode layer. The adhesion layer is a conductor, such as aluminum, gold, silicon, germanium, copper, or an alloy of one or more thereof. The second top-layer electrode is a single layer structure or a multilayer stack structure, and the second top-layer electrode is made from a conductive material. The second substrate having the circuit is bonded correspondingly to the first substrate within which the MEMS microphone is formed via the adhesion layer of the first top-layer electrode.

In another embodiment of the present invention, the first top-layer electrode may be a single layer structure or a multilayer stack structure, and the first top-layer electrode is made from a conductive material. The second top-layer electrode includes an electrode layer formed on the third surface of the second substrate and an adhesion layer located on a surface of the electrode layer. The second substrate having the circuit is bonded correspondingly to the first substrate within which the MEMS microphone is formed via the adhesion layer of the second top-layer electrode.

In the MEMS microphone and the forming method therefore according to the embodiment of the present invention, the first base-structure is bonded to the second base-structure via the first top-layer electrode and the second top-layer electrode. Specifically, the second base-structure having the circuit is bonded correspondingly to the first base-structure having the MEMS microphone via the first top-layer electrode and the second top-layer electrode, and the first top-layer electrode corresponds to the second top-layer electrode. The MEMS microphone formed in the embodiment of the present invention has a small size and high performance. The MEMS microphone and the forming method therefore according to the embodiment of the present invention has a simple manufacturing and packaging process, a small size, good signal-to-noise ratio performance, and high interference immunity.

A MEMS microphone formed by the method for forming a MEMS microphone described above includes: a first substrate; a dielectric layer located on a surface of the first substrate; a first top-layer electrode located on a surface of the dielectric layer; a second top-layer electrode located on a surface of the first top-layer electrode; a second top-layer electrode; a second substrate which has a circuit formed within; an air cavity running through the first substrate and located within the second substrate; a sensitive diaphragm located within the air cavity; and a fixed electrode located within the air cavity and corresponding to the sensitive diaphragm; with a plurality of through holes running through the fixed electrode are formed.

Specifically, the first top-layer electrode is a single layer structure or a multilayer stack structure. In the case where the first top-layer electrode is a single layer structure, the first top-layer electrode is made from a conductor material, such as aluminum, gold, silicon, germanium, copper, or an alloy of one or more thereof.

In the case where the first top-layer electrode is a multilayer stack structure, the first top-layer electrode includes a polycrystalline silicon electrode layer formed on the surface of the dielectric layer and an adhesion layer located on a surface of the polycrystalline silicon electrode layer.

The second top-layer electrode is a single layer structure or a multilayer stack structure. In the case where the second top-layer electrode is a single layer structure, the second top-layer electrode is made from a conductor material, such as aluminum, gold, silicon, germanium, copper, or an alloy of one or more thereof.

In the case where the second top-layer electrode is a multilayer stack structure, the second top-layer electrode includes an electrode layer formed on the third surface of the second substrate and an adhesion layer located on a surface of the electrode layer.

The MEMS microphone further includes a plurality of interconnects, which are located on the first substrate and located in the same layer as the sensitive diaphragm.

The MEMS microphone further includes a conductive plug located within the dielectric layer and electrically coupled to the interconnect. The conductive plug is made from the same material as the fixed electrode, which is polycrystalline silicon.

It should also be noted that in the case where the first top-layer electrode is a multilayer stack structure, the polycrystalline silicon electrode layer of the first top-layer electrode is located in the same layer as the fixed electrode, and is made from the same material as the fixed electrode.

The MEMS microphone according to the embodiment of the present invention has a small size, high performance, good signal-to-noise ratio performance, and high interference immunity.

Second Embodiment

Figure 4:
FIG. 4 is a schematic flowchart of a method for forming a MEMS microphone according to a second embodiment of the present invention.

The method for forming the MEMS microphone of the present invention will be described in detail in conjunction with the second embodiment below. FIG. 4 is a schematic flowchart of a method for forming a MEMS microphone according to a second embodiment of the present invention, and the method includes the following steps S201 to S212.

Step S201, providing a first substrate having a first surface and a second surface opposite to the first surface.

Step S202, forming, on the first surface of the first substrate, a sensitive diaphragm and a plurality of interconnects.

Step S203, forming a dielectric layer by which the sensitive diaphragm and the plurality of interconnects are covered.

Step S204, forming a plurality of first through holes within the dielectric layer, with the first through holes being corresponding to the interconnect.

Step S205, forming a polycrystalline silicon layer on a surface of the dielectric layer, with the polycrystalline silicon layer filling the first through hole.

Step S206, etching the polycrystalline silicon layer to form a fixed electrode corresponding to the sensitive diaphragm and a top-layer electrode corresponding to the first through hole, with the fixed electrode having a second through hole running through the fixed electrode.

Step S207, forming a bonding layer on a surface of the top-layer electrode to form a first top-layer electrode.

Step S208, providing a second substrate within which a circuit is formed, with the second substrate having a third surface and a fourth surface, a second top-layer electrode being formed on the third surface of the second substrate, and the second top-layer electrode being corresponding to the first top-layer electrode.

Step S209, aligning the second top-layer electrode with the first top-layer electrode, and bonding the second top-layer electrode to the first top-layer electrode via the bonding layer.

Step S210, removing a part of the first substrate from the second surface to form a first opening.

Step S211, removing a part of the second substrate from the fourth surface to form a second opening.

Step S212, removing the dielectric layer corresponding to the first opening from the first opening and/or the second opening, until the first opening becomes in communication with the second opening, so as to form an air cavity.

FIG. 5 to FIG. 16 are process diagrams of a method for forming the MEMS microphone according to the second embodiment of the present invention.

Figure 5:
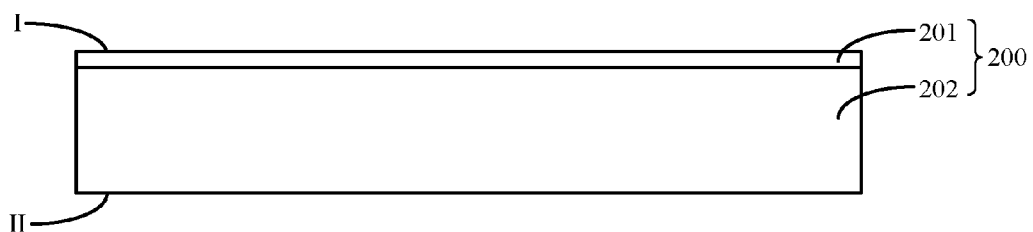
FIG. 5 to FIG. 16 are process diagrams of a method for forming the MEMS microphone according to the second embodiment of the present invention.

Referring to FIG. 5, by carrying out step S201, a first substrate 200 is provided. The first substrate 200 has a first surface I and a second surface II opposite to the first surface I.

The first substrate 200 may be made from a semiconductor material. For example, the first substrate 200 may be made from a single crystal semiconductor material such as single crystal silicon or single crystal silicon-germanium (e.g., a group II-VI compound semiconductor and a group III-V compound semiconductor). And the first substrate 200 may also be an amorphous substrate and a polycrystalline.

As an embodiment of the present invention, the first substrate 200 is a single crystal silicon substrate 202 having an upper surface on which an insulating layer 201 is formed. The first surface I of the first substrate 200 is the upper surface of the insulating layer 201, and the second surface II of the second substrate 200 is a lower surface of the single crystal silicon substrate 202. The insulating layer 201 is adapted to isolate a sensitive diaphragm from a plurality of interconnects formed in the subsequent step.

The insulating layer 201 may be made from silicon oxide, silicon nitride or silicon oxynitride. The process for forming the insulating layer 201 is a deposition process or a thermal oxidation process. In this embodiment, the insulating layer 201 may be made from silicon oxide material, and the insulating layer 201 is formed by performing oxidation on the first surface of the single crystal silicon substrate 202 by a thermal oxidation process. The thickness and the material of the insulating layer 201 can be selected by those skilled in the art depending on the MEMS microphone to be formed. It should be noted specifically here that the scope of protection of the present invention should not be limited excessively.

Figure 6:
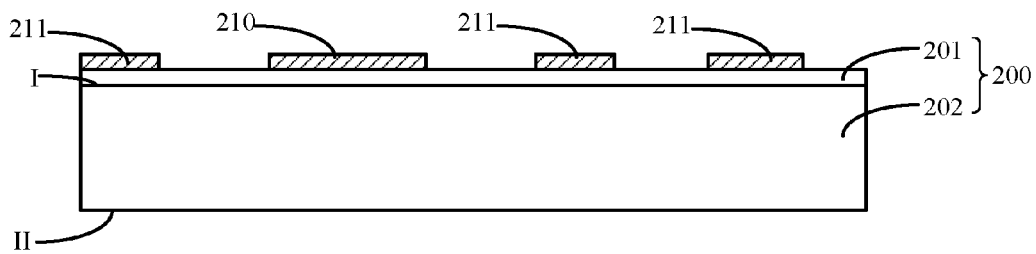

Referring to FIG. 6, by carrying out step S202, a sensitive diaphragm 210 and a plurality of interconnects 211 are formed on the first surface I of the first substrate 200.

The sensitive diaphragm 210 is adapted to form a capacitor with a fixed electrode to be formed later. The sensitive diaphragm 210 may vibrate under the stimulus of an acoustic signal to convert the acoustic signal into an electrical signal. The sensitive diaphragm 210 is made from low stress polycrystalline silicon material, and the shape of the sensitive diaphragm 210 may be square, circular or other shapes. A suitable shape of the sensitive diaphragm 210 can be selected by those skilled in the art depending on the MEMS microphone to be formed. It should be noted specifically here that the scope of protection of the present invention should not be limited excessively. It should also be noted here that the sensitive diaphragm 210 is made from low stress polycrystalline silicon material, so that the size and the production cost of the MEMS microphone using the sensitive diaphragm 210 can be further reduced.

The interconnect 211 is adapted to electrically couple the sensitive diaphragm 210 of the MEMS microphone. The interconnect 211 is made from a conductive material. The position where the interconnect 211 is formed, the number and the shape of the interconnect 211 may be determined depending on the specific MEMS microphone and can be selected by those skilled in the art depending on the MEMS microphone to be formed. It should be noted specifically here that the scope of protection of the present invention should not be limited excessively.

It should also be noted that in this embodiment, the interconnect 211 may be made from the same material as that of the sensitive diaphragm 210, which is low stress polycrystalline silicon. Thus the interconnect 211 may be formed in the same deposition process and the same etching process as the sensitive diaphragm 210, so as to eliminate some process steps.

The specific step of forming the interconnect 211 and the sensitive diaphragm 210 includes: depositing a low stress polycrystalline silicon thin film (not shown) on the first surface I of the first substrate 200 by a chemical vapor deposition process; forming a photoresist layer (not shown) on a surface of the low stress polycrystalline silicon thin film; exposing and developing the photoresist layer using a mask corresponding to the interconnect 211 and the sensitive diaphragm 210 so as to form a photoresist pattern; and removing the low stress polycrystalline silicon thin film by a plasma etching process by using the photoresist pattern as a mask, until the first substrate 200 is exposed, so as to form the interconnect 211 and the sensitive diaphragm 210. In this embodiment, the interconnect and the sensitive diaphragm are formed by etching the same polycrystalline silicon thin film, thus the interconnect is located in the same layer as the sensitive diaphragm.

In the case where the material of the interconnect 211 is different from that of the sensitive diaphragm 210, a forming method in which the interconnect 211 is formed firstly and then the sensitive diaphragm 210 is formed, or another forming method in which the sensitive diaphragm 210 is formed firstly and then the interconnect 211 is formed, may be adopted, which will not be described in detail here.

It should also be noted that in order to improve the conductivity characteristic of the interconnect 211 and the sensitive diaphragm 210 and reduce the stress on the sensitive diaphragm 210, the low stress polycrystalline silicon thin film may be doped when or after the low stress polycrystalline silicon thin film is formed so as to reduce the resistance of the interconnect 211 and the sensitive diaphragm 210, and the low stress polycrystalline silicon thin film may be annealed so as to reduce the stress on the sensitive diaphragm 210. An ion implantation process or an in situ deposition and doping process may be used as the doping process, and a rapid annealing or a tube furnace annealing may be used as the annealing process.

Figure 7:
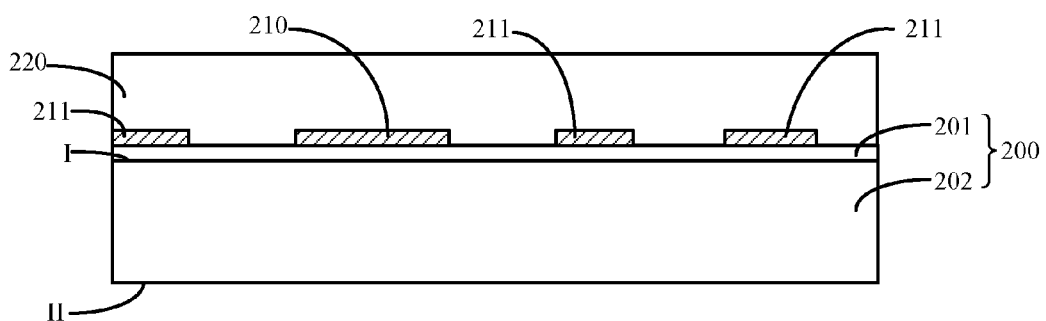

Referring to FIG. 7, by carrying out step S203, a dielectric layer 220 is formed, by which the sensitive diaphragm 210 and the plurality of interconnects 211 are covered.

The dielectric layer 220 is made from a material which has a selective etching characteristic with respect to the sensitive diaphragm 210 and the interconnect 211. Specifically, the dielectric layer 220 is made from silicon oxide.

The dielectric layer 220 is adapted to form an air cavity within the dielectric layer in the subsequent step, that is, a portion of the dielectric layer 220 corresponding to the air cavity will serve as a sacrifice layer which will be removed in the subsequent step. The remaining portion of the dielectric layer 220 is adapted to electrically isolate the interconnect 211 from a conductive electrode to be formed later.

The process for forming the dielectric layer 220 is a deposition process, and is preferably a chemical vapor deposition.

Figure 8:
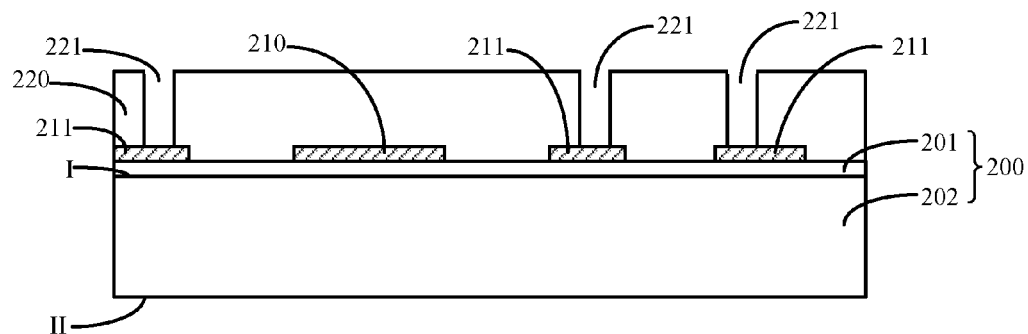

Referring to FIG. 8, by carrying out step S204, a plurality of first through holes 211 are formed within the dielectric layer 220, with the first through holes 221 being corresponding to the interconnect 211.

A conductive plug is formed after the first through hole 221 is filled with a conductive material. The conductive plug is adapted to electrically couple the interconnect 211 to an electrode corresponding to the interconnect 211 and located in other layers.

The specific step of forming the first through hole 221 includes: forming a photoresist layer (not shown) on a surface of the dielectric layer 220; exposing and developing the photoresist layer using a mask corresponding to the through hole 221 so as to form a photoresist pattern; etching the dielectric layer 220 by using the photoresist pattern as a mask to form the first through hole 221, wherein the etching process may be wet etching or dry etching; and removing the photoresist pattern after the first through hole 221 is formed, wherein the removing process may be an ashing process.

Figure 9:
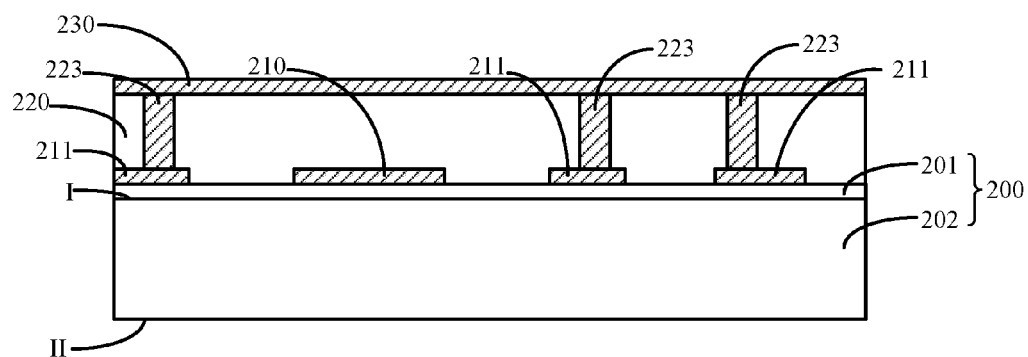

Referring to FIG. 9, by carrying out step S205, a polycrystalline silicon layer 230 is formed on a surface of the dielectric layer 220, with the polycrystalline silicon layer 203 filling the first through hole 221.

A conductive plug 223 is formed by filling the first through hole 221. The polycrystalline silicon layer 230 formed on the surface of the dielectric layer 220 is adapted to form a fixed electrode and a first top-layer electrode in the subsequent step. Thereby the conductive plug 223 can be formed in the same deposition process as the polycrystalline silicon layer 230, so as to eliminate some process steps.

It should be noted that in this embodiment, the conductive plug 223 is formed in the same deposition process as the polycrystalline silicon layer 230. Thereby the conductive plug 223 is made from the same material as that of the first top-layer electrode and the fixed electrode to be formed later, which is polycrystalline silicon.

In other embodiments, the first through hole 221 may also be filled with a conductive material, and then a conductive material layer is formed on the surface of the dielectric layer 220. A suitable process can be selected by those skilled in the art depending on the specific process requirement. It should be noted specifically here that the scope of protection of the present invention should not be limited excessively.

Figure 10:
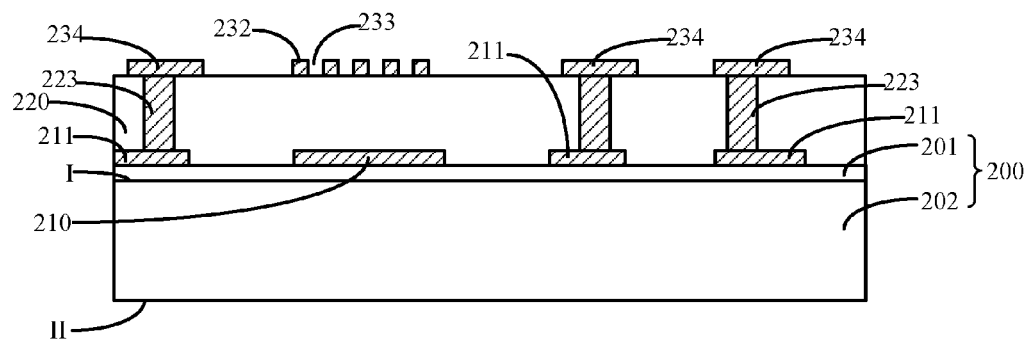

Referring to FIG. 10, by carrying out step S206, the polycrystalline silicon layer 230 is etched to form a fixed electrode 232 corresponding to the sensitive diaphragm 210 and a top-layer electrode 234 corresponding to the first through hole 221, with the fixed electrode 232 having a second through hole 233 running through the fixed electrode 232.

The specific step of forming the fixed electrode 232 and top-layer electrode 234 includes: forming a photoresist layer on a surface of the polycrystalline silicon layer 230; exposing and developing the photoresist layer using a mask corresponding to the fixed electrode 232 and the top-layer electrode 234 so as to form a photoresist pattern; and etching the polycrystalline silicon layer 230 by using the photoresist pattern as a mask, so as to form the fixed electrode 232 and the top-layer electrode 234, with a plurality of second through holes 233 running through the fixed electrode 232 being formed within the fixed electrode 232, and the top-layer electrode 234 being electrically coupled to the conductive plug 223; and removing the photoresist pattern. It should be noted that the top-layer electrode 234 and the fixed electrode 232 are formed by etching the same polycrystalline silicon layer 230, and thereby the top-layer electrode 234 is located in the same layer as the fixed electrode 232.

The fixed electrode 232 is adapted to form a capacitor with the sensitive diaphragm 210 formed previously, and convert the acoustic signal sensed by the capacitor into an electrical signal.

The second through hole 233 running through the fixed electrode 232 is formed in the fixed electrodes 232. The second through hole 233 is adapted to pass through an acoustic signal, so that the acoustic signal is able to pass through the fixed electrode 232 without being isolated, therefore the acoustic signal can be sensed by the sensitive diaphragm 210.

Figure 11:
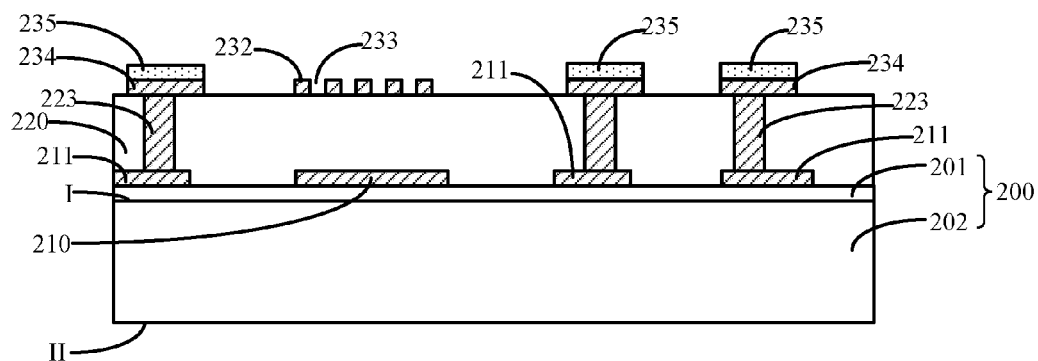

Referring to FIG. 11, by carrying out step S207, a bonding layer 235 is formed on a surface of the top-layer electrode 234 to from a first top-layer electrode.

The bonding layer 235 is adapted to bond a first substrate 200 to a second substrate.

The bonding layer 235 is made from a conductive bonding material, such as aluminum, gold, silicon, germanium, copper, or an alloy of one or more thereof.

The bonding layer 235 is formed on the surface of the top-layer electrode 234 by electron beam evaporation, sputtering or plating process, depending on the material of the bonding layer 235.

The bonding layer 235 and the top-layer electrode 234 constitute the first top-layer electrode in this embodiment.

Figure 12:
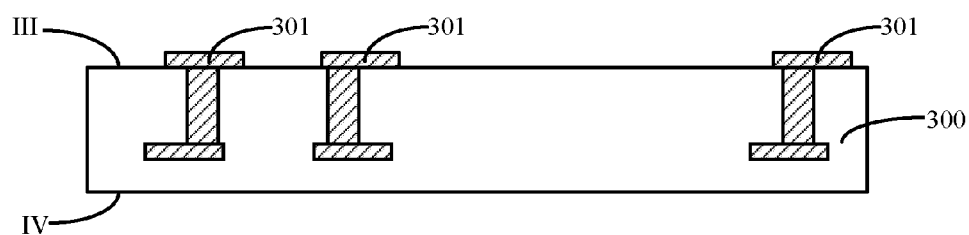

Referring to FIG. 12, by carrying out step S208, a second substrate 300 is provided, within which a circuit or a wiring is formed, with the second substrate 300 having a third surface III and a fourth surface IV, a second top-layer electrode 301 being formed on the third surface III of the second substrate 300, and the second top-layer electrode 301 being corresponding to the first top-layer electrode 234.

The second substrate 300 may include a semiconductor material. For example, the second substrate 300 may include a single crystal semiconductor material such as single crystal silicon or single crystal silicon-germanium.

The circuit (not shown) formed within the second substrate 300 functions to drive provide a drive bias to the MEMS microphone and process a signal output by the MEMS microphone. That is, when the MEMS microphone receives an acoustic signal, the acoustic signal can be sensed by the sensitive diaphragm 210 and transmitted to the circuit via the interconnect electrically coupled to the sensitive diaphragm 210 or the fixed electrode 232, and processed by the circuit.

The circuit may be a CMOS circuit. The forming process for the circuit is a standard forming process for a CMOS circuit, which will not be described in detail here. A suitable CMOS circuit can be selected by those skilled in the art depending on a design and parameter of the MEMS microphone. Practically, the circuit may also be other circuits which are formed within the second substrate 300, drive the MEMS microphone, and process the signal output by the MEMS microphone. It should be noted specifically here that the scope of protection of the present invention should not be limited excessively.

A second top-layer electrode 301 is formed on the third surface III of the second substrate 300. The second top-layer electrode 301 is coupled to the CMOS circuit via the conductive plug located within the second substrate 300. It should also be noted that part of the second top-layer electrode 301 is corresponding to the first top-layer electrode, and is adapted to bond to the first top-layer electrode, so as to bond correspondingly the first substrate to the second substrate and form an electrical connection structure.

The forming process for the second top-layer electrode 301 may be an existing semiconductor process. The specific step of forming the second top-layer electrode 301 include: forming a conductive material layer on the third surface III of the second substrate 300; and removing a redundant portion of the conductive material layer by lithography process.

Figure 13:
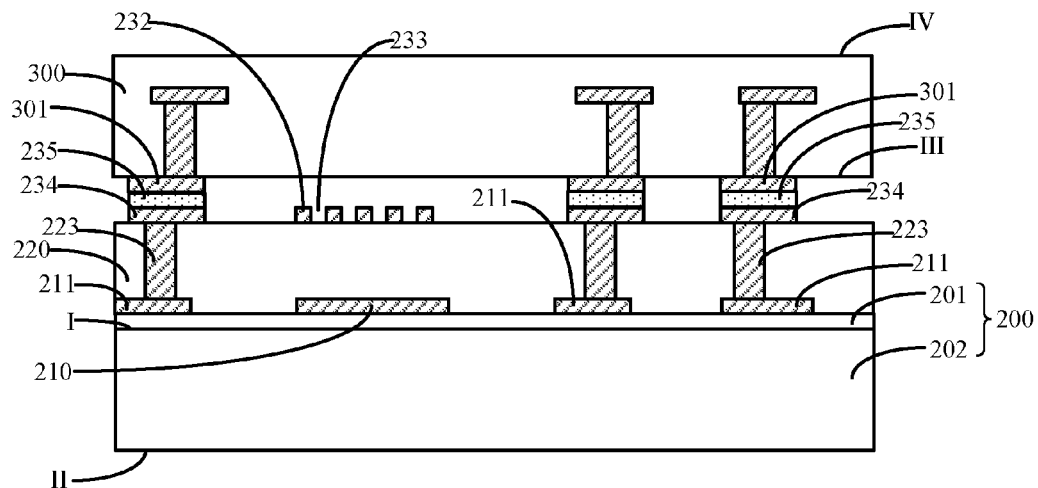

Referring to FIG. 13, by carrying out step S209, the second top-layer electrode 301 is aligned with the first top-layer electrode, and the second top-layer electrode 301 is bonded to the first top-layer electrode via the bonding layer 235.

It is known from the previous steps that the bonding layer 235 is made from a conductive bonding material. Taking the bonding layer 235 is made from gold-tin alloy as an example, the second top-layer electrode 301 is aligned with the first top-layer electrode, and an annealing process is carried out, so that the second top-layer electrode 301 is bonded to the first top-layer electrode.

In this embodiment, the first top-layer electrode corresponds to the second top-layer electrode 301. In this step, the first substrate is bonded to the second substrate, and the CMOS circuit is electrically coupled to the MEMS microphone via the second top-layer electrode 301 and the first top-layer electrode, and no additional wire-bonding process is needed.

Figure 14:
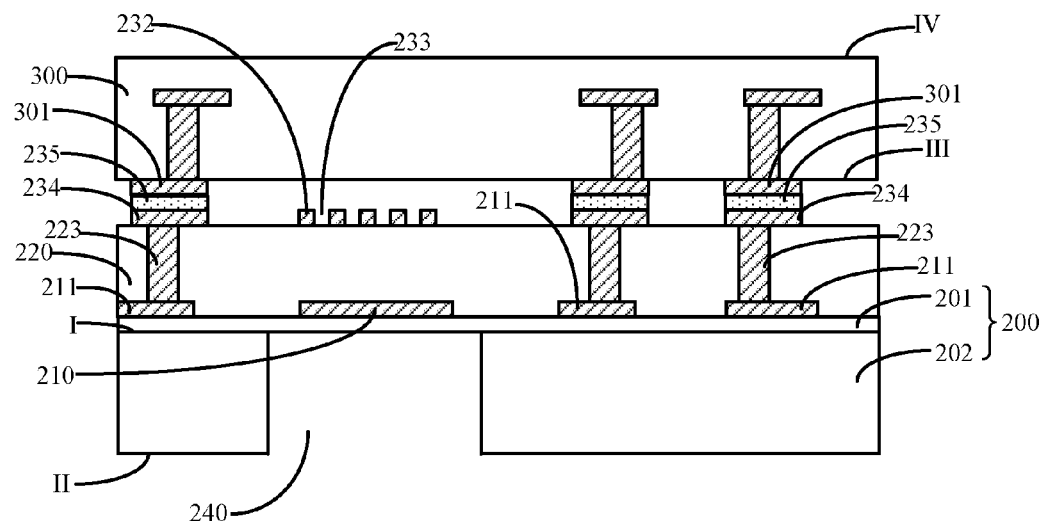

Referring to FIG. 14, by carrying out step S210, a part of the first substrate 200 is removed from the second surface II to form a first opening 240.

The first opening 240 is adapted to be an acoustic signal transmission port of the MEMS microphone, via which an acoustic signal is passed through to the sensitive diaphragm 210 of the MEMS microphone.

The process for forming the first opening 240 is an etching process, and specifically may be wet etching or dry etching.

The depth of the removed portion of the first substrate 200 can be set by those skilled in the art depending on the specific process requirement. The sensitive diaphragm 210 may be exposed through the first opening, that is, the first opening runs through the first substrate 200. The running through the substrate 200 of the first opening 210 has a simple process, and no additional step of removing the remaining first substrate 200 is needed later.

In this embodiment, the insulating layer 201 is exposed by the first opening 240 formed in step S210, that is, the first opening 240 runs through the single crystal silicon substrate 202. The first opening 240 formed in this embodiment does not run through the first substrate 200, and the insulating layer 201 remains. The reason for this is that the etching process for the first opening 240 is generally a fast etching process, and the etching rate is high, and if the sensitive diaphragm 210 is exposed when the etching is carried out, the sensitive diaphragm 210 tends to be damaged due to the excessively fast rate, thereby resulting in the lowered performance of the MEMS microphone. In this embodiment, the sensitive diaphragm 210 may be protected by the insulating layer 201, so that the sensitive diaphragm 210 will not be damaged during the etching process. The insulating layer 201 is removed in a subsequent etching step having a strong controllability on etching. Thereby both the efficiency of the process step and the process will be improved.

The specific step of forming the first opening includes: forming, on the second surface II, a photoresist pattern corresponding to the first opening 240; and etching the first substrate 200 by using the photoresist pattern as a mask, until the insulating layer 201 is exposed, so as to form the first opening 240.

Figure 15:
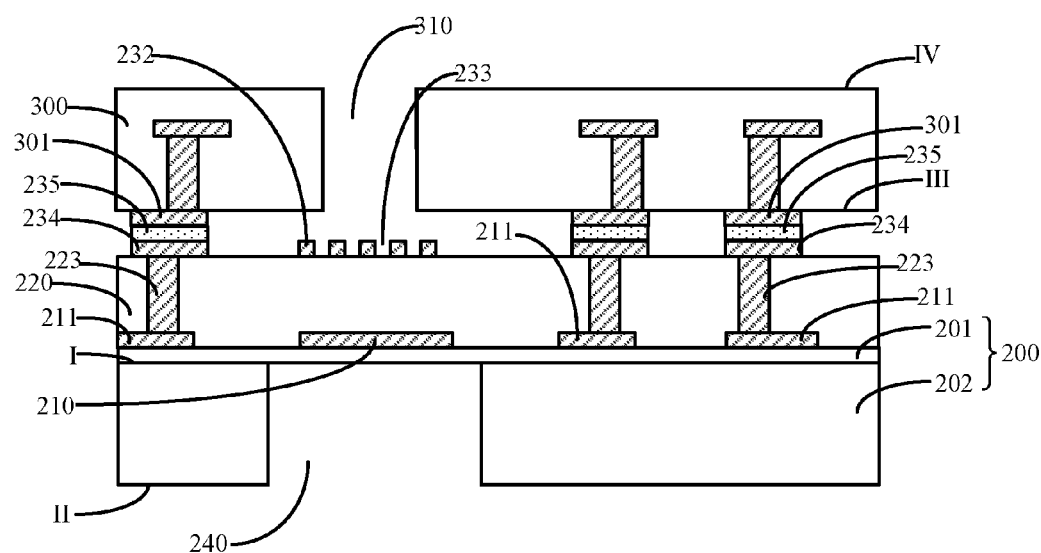

Referring to FIG. 15, by carrying out step S210, a part of the second substrate 300 is removed from the fourth surface IV to form a second opening 310.

The second opening 310 is adapted to form an acoustic signal transmission passage.

The forming process for the second opening 310 is an etching process, and specifically may be wet etching or dry etching.

In this embodiment, the specific step of forming the second opening 310 includes: forming, on the fourth surface IV, a photoresist pattern corresponding to the second opening 310; etching the second substrate 300 by using the photoresist pattern as a mask, until the fixed electrode 232 is exposed entirely, so as to form the second opening 310.

Figure 16:
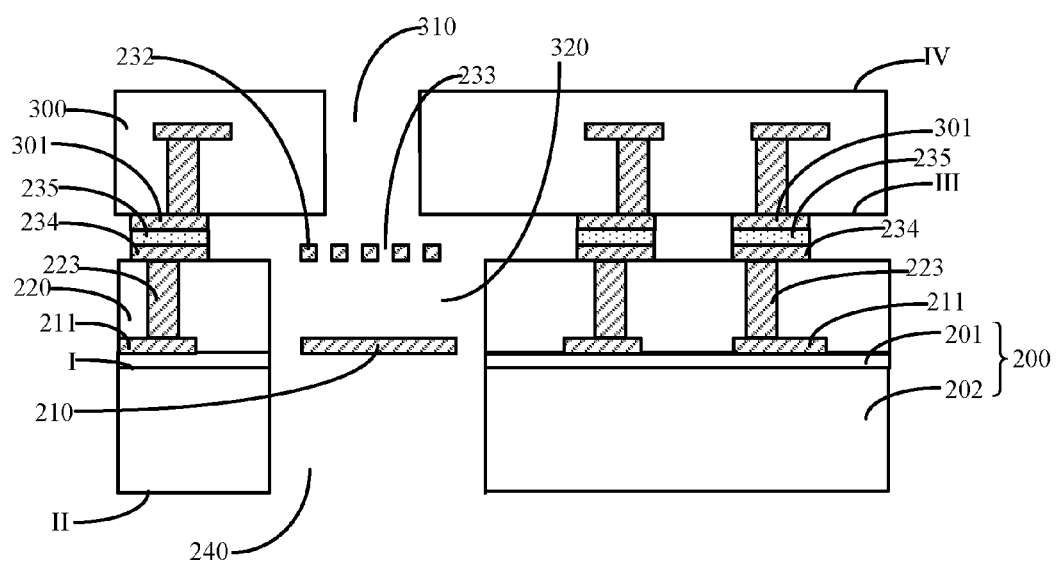

Referring to FIG. 16, by carrying out step S212, the dielectric layer 220 corresponding to the first opening 240 is removed from the first opening 240 and/or the second opening 310, until the first opening 240 becomes in communication with the second opening 310, so as to form an air cavity 320.

It should be noted that the insulating layer 201 by which the sensitive diaphragm 210 is protected may be removed while the dielectric layer 220 is removed. The sensitive diaphragm 210 will not be damaged because this removing process has a higher selectivity.

The air cavity 320 is adapted to provide a space for the sensitive diaphragm 210, so that the sensitive diaphragm 210 is able to vibrate within the air cavity 320.

Referring to FIG. 16, the MEMS microphone formed adopting the package structure of the MEMS microphone described above includes:

a first substrate 200; a plurality of interconnects 211 formed on the first surface I of the first substrate 200; a dielectric layer 220 by which the plurality of interconnects 211 are covered; a conductive plug 223 located within the dielectric layer 220 and electrically coupled to the interconnect 211; a first top-layer electrode 234 located on the surface of the dielectric layer 220 and electrically coupled to the conductive plug 223; a bonding layer 235 located on a surface of the first top-layer electrode 234; a second top-layer electrode 301 located on a surface of the bonding layer 235 and corresponding to the first top-layer electrode 234; a second substrate 300 within which a circuit is formed, located on a surface of the second top-layer electrode 301; an air cavity 320 running through the first substrate 200 and the second substrate 300; a sensitive diaphragm 210 located within the air cavity 320 and located in the same layer as the interconnect 211; and a fixed electrode 232 corresponding to the sensitive diaphragm 210 and located in the same layer as the first top-layer electrode 234 located within the air cavity 320; with a second through hole 233 miming through the fixed electrode 232.

The first substrate 200 may include a semiconductor material. For example, the first substrate 200 may include a single crystal semiconductor material such as single crystal silicon or single crystal silicon-germanium. And the first substrate 200 may include an amorphous substrate and a polycrystalline, such as a glass substrate.

The sensitive diaphragm 210 is made from low stress polycrystalline silicon material. The interconnect 211 is adapted to electrically couple the sensitive diaphragm 210 of the MEMS microphone. The interconnect 211 is made from a conductive material.

The first top-layer electrode 234, the conductive plug 223, and the fixed electrode 232 are made from polycrystalline silicon material.

The second substrate 300 may include a semiconductor material. For example, the second substrate 300 may include a single crystal semiconductor material such as single crystal silicon or single crystal silicon-germanium.

A circuit or a wiring (not shown) is formed within the second substrate 300. The circuit functions to drive the MEMS microphone. That is, when the MEMS microphone receives an acoustic signal, the acoustic signal can be sensed by the sensitive diaphragm 210 and transmitted to the circuit via the interconnect electrically coupled to the sensitive diaphragm 210 or the fixed electrode 232, and processed by the circuit. The circuit may be a CMOS circuit.

It should also be noted that the MEMS microphone formed in the second embodiment may further include a travel stopper (not shown) which is adapted to prevent the stiction between the sensitive diaphragm and the fixed electrode. As for the forming method for the travel stopper, reference may be made to the existing method for forming the travel stopper of the MEMS microphone, which will not be described in detail here.

In the MEMS microphone and the forming method therefore provided in the present invention, the second substrate having a circuit is packaged correspondingly to the first substrate on which the MEMS microphone is formed via the first top-layer electrode 234 and the second top-layer electrode 301. Specifically, the first top-layer electrode 234 is corresponding to the second top-layer electrode 301. The MEMS microphone formed in the present invention has a small size. The MEMS microphone and the forming method therefore according to this embodiment has a simple manufacturing and packaging process, a small size, good signal-to-noise ratio performance, and high interference immunity.

Third Embodiment

Figure 17:
FIG. 17 is a schematic flowchart of a method for forming a MEMS microphone according to a third embodiment of the present invention.

The method for forming the MEMS microphone of the present invention will be described in detail in conjunction with the third embodiment below. FIG. 17 is a schematic flowchart of a method for forming a MEMS microphone according to a third embodiment of the present invention, and the method includes the following steps S301 to S312.

Step S301, providing a first substrate having a first surface and a second surface opposite to the first surface.

Step S302, forming, on the first surface of the first substrate, a sensitive diaphragm and a plurality of interconnects.

Step S303, forming a dielectric layer by which the sensitive diaphragm and the plurality of interconnects are covered.

Step S304, forming a plurality of first through holes within the dielectric layer, with the first through holes being corresponding to the interconnect.

Step S305, forming a polycrystalline silicon layer on a surface of the dielectric layer, with the polycrystalline silicon layer filling the first through hole.

Step S306, etching the polycrystalline silicon layer to form a fixed electrode corresponding to the sensitive diaphragm and a top-layer electrode corresponding to the first through hole, with the fixed electrode having a second through hole running through the fixed electrode.

Step S307, providing a second substrate within which a circuit is formed, with the second substrate having a third surface and a fourth surface, and a top-layer electrode being formed on the third surface of the second substrate.

Step S308, forming a bonding layer on a surface of the top-layer electrode to from a second top-layer electrode, with the second top-layer electrode being corresponding to the first top-layer electrode.

Step S309, aligning the second top-layer electrode with the first top-layer electrode, and bonding the second top-layer electrode to the first top-layer electrode via the bonding layer.

Step S310, removing a part of the first substrate from the second surface to form a first opening.

Step S311, removing a part of the second substrate from the fourth surface to form a second opening.

Step S312, removing the dielectric layer corresponding to the first opening from the first opening and/or the second opening, until the first opening becomes in communication with the second opening, so as to form an air cavity.

As for the forming process for the specific step of this embodiment, reference may be made to the specific forming process of the second embodiment. It should be noted that the difference between this embodiment and the first embodiment is that the bonding layer is formed on the top-layer electrode on the second substrate, and the top-layer electrode on the second substrate and the bonding layer located on the top-layer electrode constitute the second top-layer electrode. A first substrate is packaged correspondingly to a second substrate via the second top-layer electrode corresponding to the first top-layer electrode. The MEMS microphone and the forming method therefore according to this embodiment has a simple manufacturing and packaging process, a small size, good signal-to-noise ratio performance, and high interference immunity.

Fourth Embodiment

Figure 18:
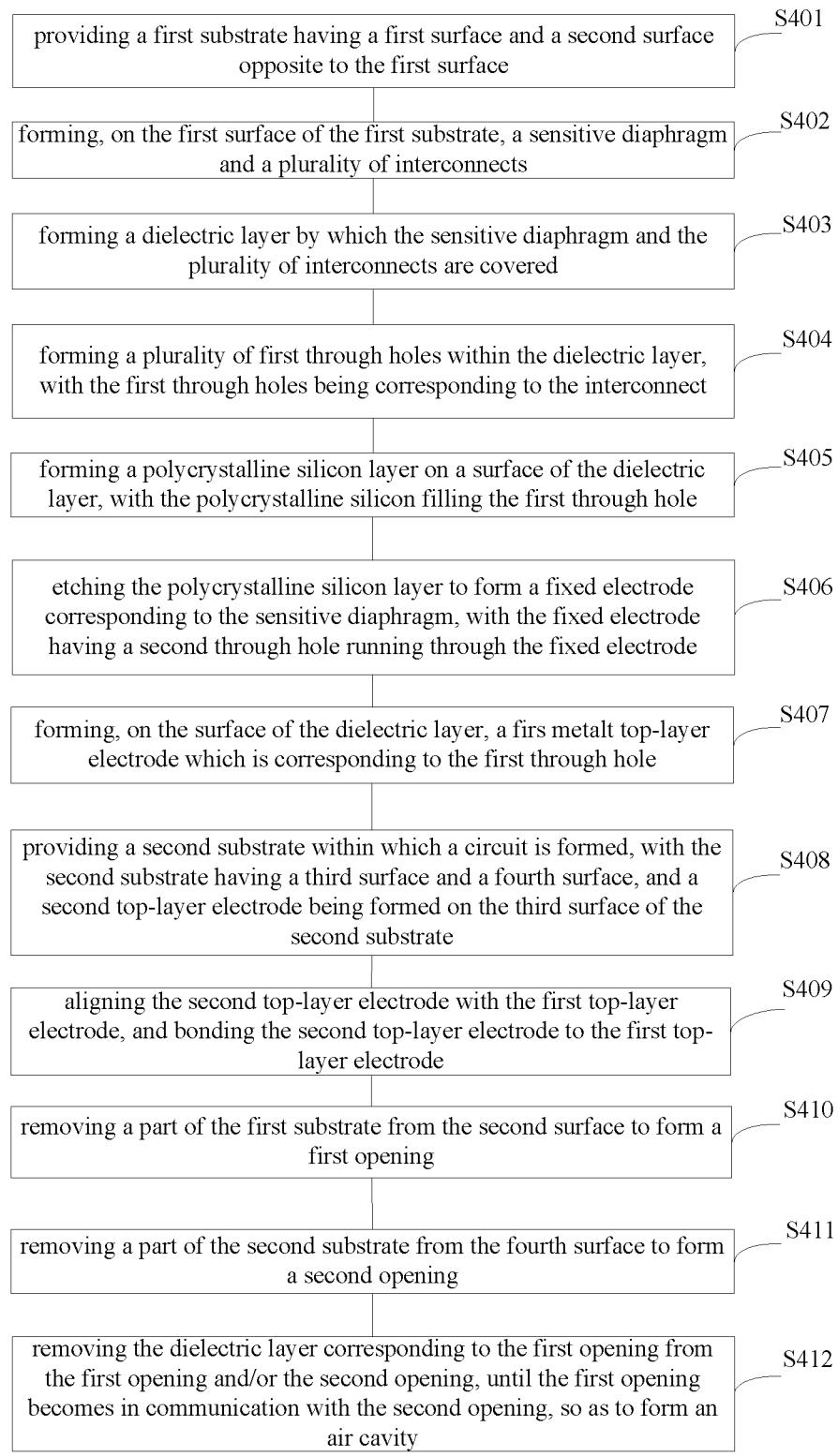
FIG. 18 is a schematic flowchart of a method for forming a MEMS microphone according to a fourth embodiment of the present invention.

The method for forming the MEMS microphone of the present invention will be described in detail in conjunction with the fourth embodiment below. FIG. 18 is a schematic flowchart of a method for forming a MEMS microphone according to a fourth embodiment of the present invention, and the method includes the following steps S401 to S412.

Step S401, providing a first substrate having a first surface and a second surface opposite to the first surface.

Step S402, forming, on the first surface of the first substrate, a sensitive diaphragm and a plurality of interconnects.

Step S403, forming a dielectric layer by which the sensitive diaphragm and the plurality of interconnects are covered.

Step S404, forming a plurality of first through holes within the dielectric layer, with the first through holes being corresponding to the interconnect.

Step S405, forming a polycrystalline silicon layer on a surface of the dielectric layer, with the polycrystalline silicon filling the first through hole.

Step S406, etching the polycrystalline silicon layer to form a fixed electrode corresponding to the sensitive diaphragm, with the fixed electrode having a second through hole running through the fixed electrode.

Step S407, forming, on the surface of the dielectric layer, a first metal top-layer electrode which corresponding to the first through hole.

Step S408, providing a second substrate within which a circuit is formed, with the second substrate having a third surface and a fourth surface, and a second top-layer electrode being formed on the third surface of the second substrate.

Step S409, aligning the second top-layer electrode with the first top-layer electrode, and bonding the second top-layer electrode to the first top-layer electrode.

Step S410, removing a part of the first substrate from the second surface to form a first opening.

Step S411, removing a part of the second substrate from the fourth surface to form a second opening.

Step S412, removing the dielectric layer corresponding to the first opening from the first opening and/or the second opening, until the first opening becomes in communication with the second opening, so as to form an air cavity.

As for step S401 to step S405, reference may be made to step S201 to step S205 in the second embodiment. As for step S406, reference may be made to step S206 which is a corresponding step of forming the fixed electrode and the second through hole.

After that, step S407 is carried out, in which a first top-layer electrode made from metal and corresponding to the first through hole is formed.

In this embodiment, the first top-layer electrode made from metal is not formed in the same deposition process or the same etching process as the fixed electrode. Instead, the first top-layer electrode made from metal and corresponding to the first through hole is formed on the surface of the dielectric layer by an additional physical vapor deposition process. The material of first top-layer electrode made from metal is a conductor, such as aluminum, gold, silicon, germanium, copper, or an alloy of one or more thereof.

After that, Step S408 is carried out. A second substrate is provided, within which a circuit is formed. The second substrate has a third surface and a fourth surface, and a second top-layer electrode being formed on the third surface of the second substrate.

The second substrate may include a semiconductor material. For example, the second substrate may include a single crystal semiconductor material such as single crystal silicon or single crystal silicon-germanium.

The circuit (not shown) formed within the second substrate functions to drive the MEMS microphone and process a signal output by the MEMS microphone. That is, when the MEMS microphone receives an acoustic signal, the acoustic signal can be sensed by the sensitive diaphragm 210, and transmitted to the circuit via the interconnect electrically coupled to the sensitive diaphragm 210 or the fixed electrode 232, and processed by the circuit.

The circuit may be a CMOS circuit. The forming process for the circuit is a standard forming process for a CMOS circuit, which will not be described in detail here. A suitable CMOS circuit can be selected by those skilled in the art depending on the design and parameter of the MEMS microphone. Practically, the circuit may also be other circuits which are formed within the second substrate, drive the MEMS microphone, and process the signal output by the MEMS microphone. It should be noted specifically here that the scope of protection of the present invention should not be limited excessively.

A second top-layer electrode is formed on the third surface of the second substrate, and the second top-layer electrode is coupled to the CMOS circuit via the conductive plug located within the second substrate. It should also be noted that the second top-layer electrode corresponds to the first top-layer electrode, and is adapted to bond to the first top-layer electrode, so as to bond the first substrate to the second substrate and form an electrical connection structure.

In this embodiment, the second top-layer electrode may be made from a conductor, such as aluminum, gold, silicon, germanium, copper, or an alloy of one or more thereof. The forming process for the second top-layer electrode is a physical vapor deposition process. Thereby the second top-layer electrode is bonded to the first top-layer electrode, and no additional bonding layer is needed.

After that, step S409 is carried out, in which the second top-layer electrode made from metal is aligned with and bonded to the first top-layer electrode.

It is known from the description of the previous steps that the second top-layer electrode made from metal and the first top-layer electrode may be made from a conductor, such as aluminum, gold, silicon, germanium, copper, or an alloy of one or more thereof. The second top-layer electrode is aligned with the first top-layer electrode, and an annealing process is carried out, so that the second top-layer electrode is bonded to the first top-layer electrode.

As for step S410 to step S412, reference may be made to step S210 to step S212 in the first embodiment.

In the MEMS microphone and the forming method therefore provided in the present invention, the second substrate having a circuit is packaged correspondingly to the first substrate within which the MEMS microphone is formed via the first top-layer electrode 234 and the second top-layer electrode 301. Specifically, the first top-layer electrode 234 corresponds to the second top-layer electrode 301. The MEMS microphone formed in the present invention has a small size. The MEMS microphone and the forming method therefore according to this embodiment has a simple manufacturing and packaging process, a small size, good signal-to-noise ratio performance, and high interference immunity.

Fifth Embodiment

Figure 19:
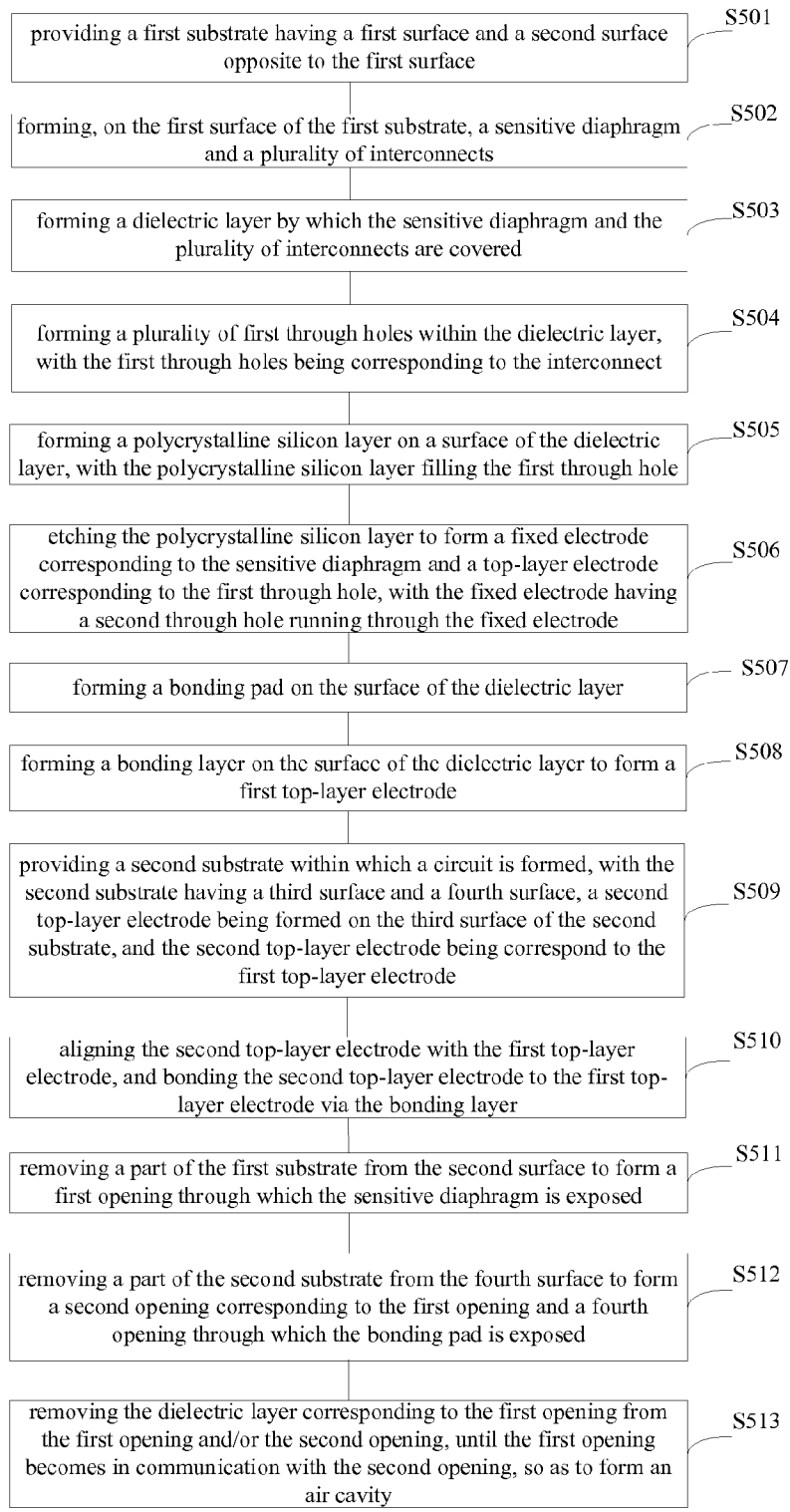
FIG. 19 is a schematic flowchart of a method for forming a MEMS microphone according to a fifth embodiment of the present invention.

The method for forming the MEMS microphone of the present invention will be described in detail in conjunction with the fifth embodiment below. FIG. 19 is a schematic flowchart of a method for forming a MEMS microphone according to a fifth embodiment of the present invention, and the method includes the following steps S501 to S513.

Step S501, providing a first substrate having a first surface and a second surface opposite to the first surface.

Step S502, forming, on the first surface of the first substrate, a sensitive diaphragm and a plurality of interconnects.

Step S503, forming a dielectric layer by which the sensitive diaphragm and the plurality of interconnects are covered.

Step S504, forming a plurality of first through holes within the dielectric layer, with the first through holes being corresponding to the interconnect.

Step S505, forming a polycrystalline silicon layer on a surface of the dielectric layer, with the polycrystalline silicon layer filling the first through hole.

Step S506, etching the polycrystalline silicon layer to form a fixed electrode corresponding to the sensitive diaphragm and a top-layer electrode corresponding to the first through hole, with the fixed electrode having a second through hole running through the fixed electrode.

Step S507, forming a bonding pad on the surface of the dielectric layer.

Step S508, forming a bonding layer on the surface of the dielectric layer to form a first top-layer electrode.

Step S509, providing a second substrate within which a circuit is formed, with the second substrate having a third surface and a fourth surface, a second top-layer electrode is formed on the third surface of the second substrate, and the second top-layer electrode corresponds to the first top-layer electrode.

Step S510, aligning the second top-layer electrode with the first top-layer electrode, and bonding the second top-layer electrode to the first top-layer electrode via the bonding layer.

Step S511, removing a part of the first substrate from the second surface to form a first opening through which the sensitive diaphragm is exposed.

Step S512, removing a part of the second substrate from the fourth surface to form a second opening corresponding to the first opening and a fourth opening through which the bonding pad is exposed.

Step S513, removing the dielectric layer corresponding to the first opening from the first opening and/or the second opening, until the first opening becomes in communication with the second opening, so as to form an air cavity.

As for step S501 to step S506, reference may be made to step S201 to step 206 and FIG. 5 to FIG. 10 in the second embodiment.

Figure 20:
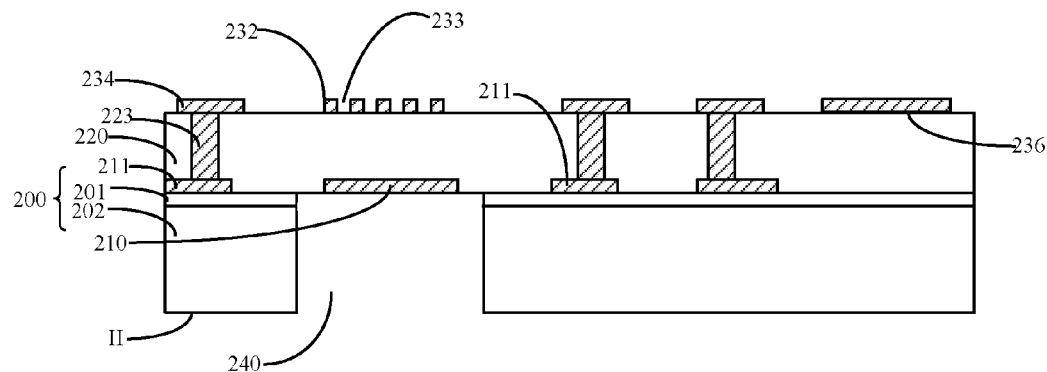
FIG. 20 to FIG. 22 are process diagrams of a method for forming the MEMS microphone according to the fifth embodiment of the present invention.

Referring to FIG. 20, by carrying out step S507, a bonding pad 236 is formed on the surface of the dielectric layer 220.

Specifically, the bonding pad is adapted to provide an electrical connection platform for the MEMS microphone. And the bonding pad is generally made from metal, for the reason that the bonding pad 236 has a larger area and need to bear a certain pressure from wire bonding. The forming process for the bonding pad 236 may be such a process in which a metal layer (not shown) is deposited by a physical vapor deposition process, and the metal layer is photoresist patterned and etched to form the bonding pad 236. The specific step of forming the bonding pad 236 can be determined by those skilled in the art depending on the specific requirement of the MEMS microphone product, and reference may be made to the existing step of forming the bonding pad.

After the bonding pad 236 is formed, step S508 to step S511 are carried out, and reference may be made to corresponding step S207 to step S210 and FIG. 11 to FIG. 16 in the second embodiment.

Figure 21:
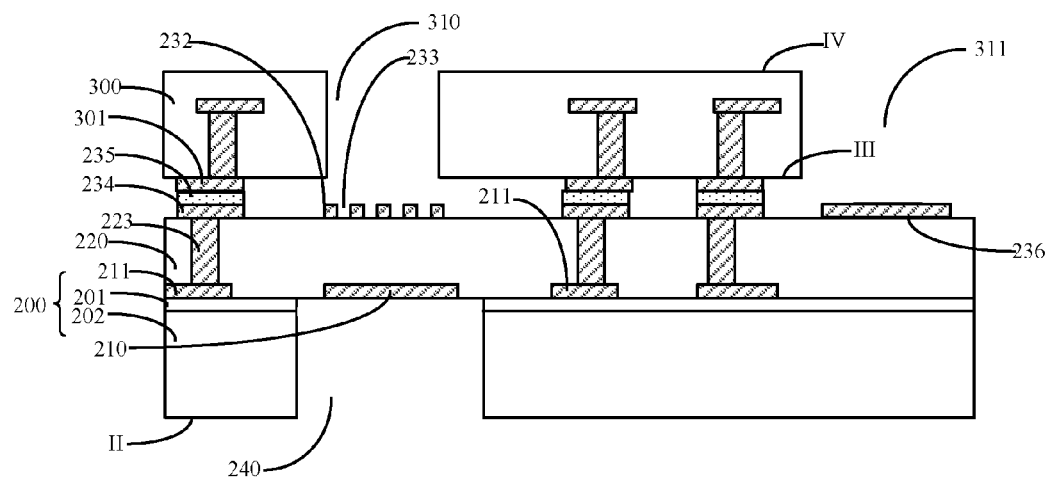

After step S511 is carried out, step S512 is carried out. Referring to FIG. 21, a part of the second substrate 300 is removed from the fourth surface IV to form a second opening 310 corresponding to the first opening 240 and a fourth opening 311 through which the bonding pad 236 is exposed.

Specifically: a photoresist pattern is formed on the fourth surface IV, with the photoresist pattern being corresponding to the second opening 310 and the fourth opening 311; and the second substrate 300 is etched by using the photoresist pattern as a mask, with the second opening 310 being formed in the same etching process as the fourth opening 311.

It should be noted that because the second opening 310 has the same depth as the fourth opening 311 due to a design characteristic of the MEMS microphone in this embodiment, the second opening 310 can be formed in the same etching process as the fourth opening 311. Thereby some process steps will be eliminated and production cost will be saved.

Figure 22:
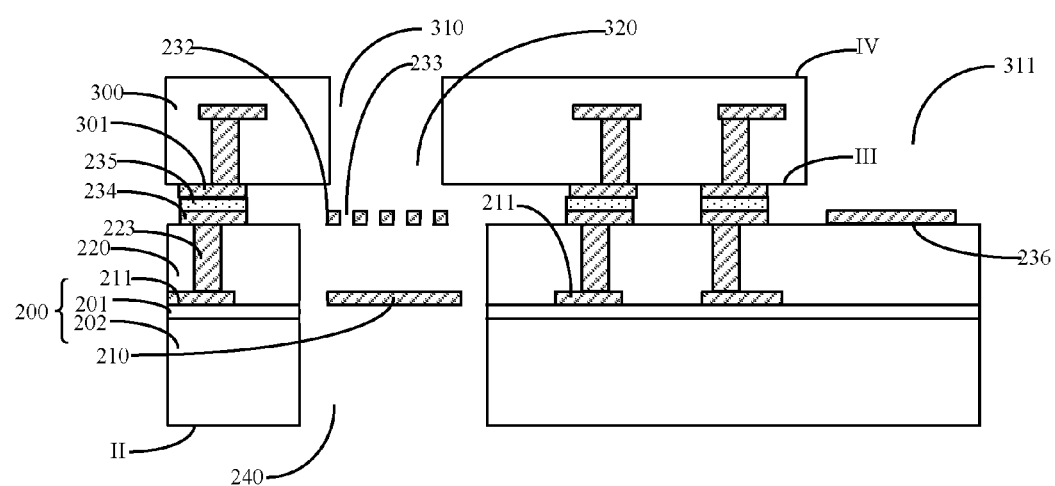

Referring to FIG. 22, by carrying out step S513, the dielectric layer 220 corresponding to the first opening 240 is removed from the first opening 240 and/or the second opening 310, until the first opening 240 becomes in communication with the second opening 310, so as to form an air cavity 320.

As for the specific forming step, reference may be made to the corresponding step in the second embodiment, which will not be described in detail here.

Referring to FIG. 22, the MEMS microphone formed by the method for forming the MEMS microphone according to the fifth embodiment includes:

a first substrate 200; a plurality of interconnects 211 formed on the first surface I of the first substrate 200; a dielectric layer 220 by which the plurality of interconnects 211 are covered; a conductive plug 223 located within the dielectric layer 220 and electrically coupled to the interconnect 211; a first top-layer electrode 234 located on a surface of the dielectric layer 220 and electrically coupled to the conductive plug 223; a bonding pad 236 located on the surface of the dielectric layer 220; a bonding layer 235 located on a surface of the first top-layer electrode 234; a second top-layer electrode 301 located on a surface of the bonding layer 235 and corresponding to the first top-layer electrode 234; a second substrate 300, within which a circuit is formed, located on a surface of the second top-layer electrode 301; an air cavity 320 running through the first substrate 200 and the second substrate 300; a sensitive diaphragm 210 located within the air cavity 320 and located in the same layer as the interconnect 211; a fixed electrode 232 located within the air cavity 320 and corresponding to the sensitive diaphragm 210 and located in the same layer as the first top-layer electrode 234; a second through hole 233 miming through the fixed electrode 232; and a fourth opening 311 through which the bonding pad 236 is exposed.

In the MEMS microphone formed in the fifth embodiment of the present invention, there is provided with the bonding pad 236 formed on the surface of the dielectric layer 220, and the bonding pad 236 is exposed through the fourth opening 311. And no additional step of forming the exposed bonding pad is needed in the subsequent packaging process, thereby some packaging process steps will be eliminated and production cost will be saved.

Sixth Embodiment

Figure 23:
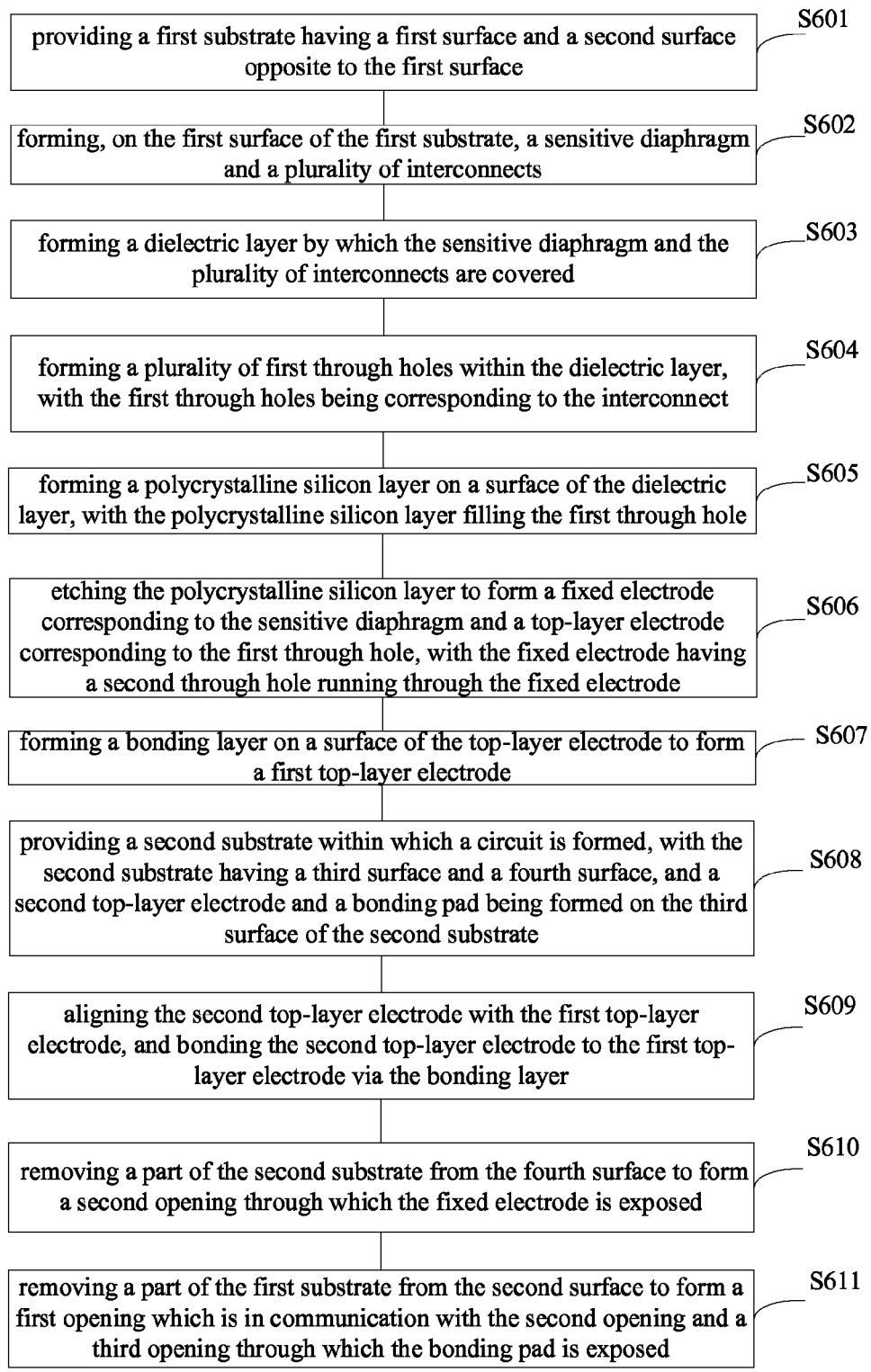
FIG. 23 is a schematic flowchart of a method for forming a MEMS microphone according to a sixth embodiment of the present invention.

The method for forming the MEMS microphone of the present invention will be described in detail in conjunction with the sixth embodiment below. FIG. 23 is a schematic flowchart of a method for forming a MEMS microphone according to a sixth embodiment of the present invention, and the method includes the following steps S601 to S611.

Step S601, providing a first substrate having a first surface and a second surface opposite to the first surface.

Step S602, forming, on the first surface of the first substrate, a sensitive diaphragm and a plurality of interconnects.

Step S603, forming a dielectric layer by which the sensitive diaphragm and the plurality of interconnects are covered.

Step S604, forming a plurality of first through holes within the dielectric layer, with the first through holes being corresponding to the interconnect.

Step S605, forming a polycrystalline silicon layer on a surface of the dielectric layer, with the polycrystalline silicon layer filling the first through hole.

Step S606, etching the polycrystalline silicon layer to form a fixed electrode corresponding to the sensitive diaphragm and a top-layer electrode corresponding to the first through hole, with the fixed electrode having a second through hole running through the fixed electrode.

Step S607, forming a bonding layer on a surface of the top-layer electrode to form a first top-layer electrode.

Step S608, providing a second substrate within which a circuit is formed, with the second substrate having a third surface and a fourth surface, and a second top-layer electrode and a bonding pad being formed on the third surface of the second substrate.

Step S609, aligning the second top-layer electrode with the first top-layer electrode, and bonding the second top-layer electrode to the first top-layer electrode via the bonding layer.

Step S610, removing a part of the second substrate from the fourth surface to form a second opening through which the fixed electrode is exposed.

Step S611, removing a part of the first substrate from the second surface to form a first opening which is in communication with the second opening and a third opening through which the bonding pad is exposed.

Specifically, as for step S601 to step S07, reference may be made to step S201 to step 207 and FIG. 5 to FIG. 11 in the second embodiment.

Figure 24:
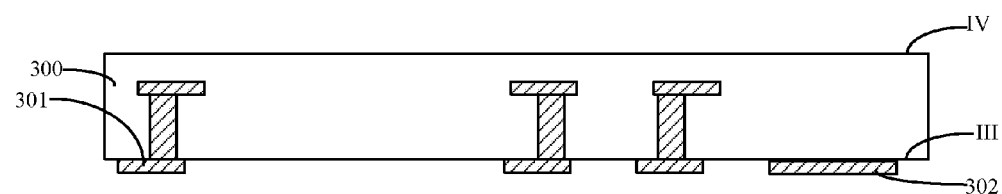
FIG. 24 to FIG. 27 are process diagrams of a method for forming the MEMS microphone according to the sixth embodiment of the present invention.

After that, step S608 is carried out. Referring to FIG. 24, a second substrate 300 is provided, within which a circuit (not shown) is formed, with the second substrate 300 having a third surface III and a fourth surface IV, and a second top-layer electrode 301 and a bonding pad 302 being formed on the third surface III of the second substrate 300.

The second substrate 300 may include a semiconductor material. For example, the second substrate 300 may include a single crystal semiconductor material such as single crystal silicon or single crystal silicon-germanium.

The circuit (not shown) formed within the second substrate 300 functions to drive the MEMS microphone and process a signal output by the MEMS microphone. That is, when the MEMS microphone receives an acoustic signal, the acoustic signal can be sensed by the sensitive diaphragm 210 and transmitted to the circuit via the interconnect electrically coupled to the sensitive diaphragm 210 or the fixed electrode 232, and processed by the circuit.

The circuit may be a CMOS circuit. The forming process for the circuit is a standard forming process for a CMOS circuit, which will not be described in detail here. A suitable CMOS circuit can be selected by those skilled in the art depending on the design and parameter of the MEMS microphone. Practically, the circuit may also be other circuits which are formed within the second substrate, drive the MEMS microphone, and process the signal output by the MEMS microphone. It should be noted specifically here that the scope of protection of the present invention should not be limited excessively.

A second top-layer electrode 301 is formed on the third surface III of the second substrate 300, which is coupled to the CMOS circuit via the conductive plug located within the second substrate. It should also be noted that the second top-layer electrode corresponds to the first top-layer electrode, and is adapted to bond to the first top-layer electrode, so as to bond the first substrate to the second substrate and form an electrical connection structure.

The forming process for the second top-layer electrode 301 is an existing semiconductor process. The specific forming step include: forming a conductive material layer on the third surface III of the second substrate 300; and removing a redundant portion of the conductive material layer by lithography process so as to form the second top-layer electrode 301.

It should be noted that a bonding pad of the MEMS microphone is also formed in step S608 in this embodiment as compared with the second embodiment.

Specifically, the bonding pad 302 is adapted to provide an electrical connection platform for the MEMS microphone. And the bonding pad 302 is generally made from metal for the reason that the bonding pad 302 has a larger area and need to bear a certain pressure from wire bonding. The forming process for the bonding pad 302 may be such a process in which a metal layer (not shown) is deposited by physical vapor deposition process, and the metal layer is photoresist patterned and etched to form the bonding pad 302. The specific step of forming the bonding pad 302 can be determined by those skilled in the art depending on the specific requirement of the MEMS microphone, and reference may be made to the existing step of forming the bonding pad.

Figure 25:
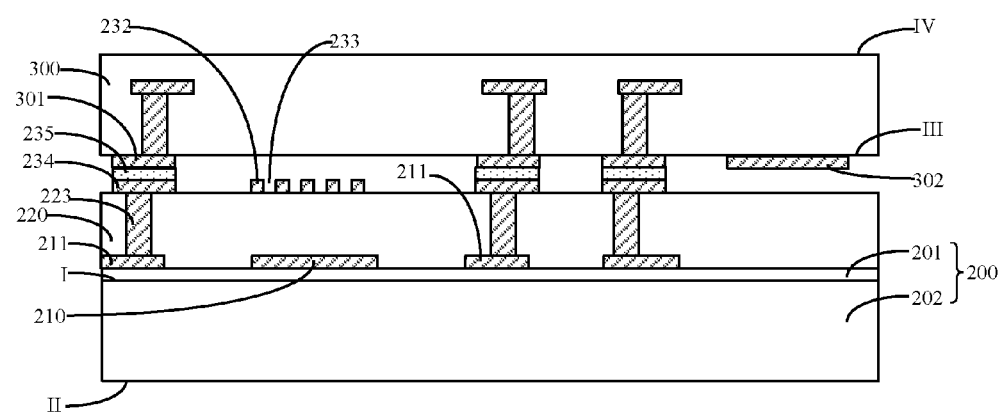

Referring to FIG. 25, by carrying out step S609, the second top-layer electrode 301 is aligned with the first top-layer electrode 234, and the second top-layer electrode 301 is bonded to the first top-layer electrode 234 via the bonding layer 235.

The bonding layer 235 is made from a conductive bonding material. Specifically, the bonding layer 235 is formed on a surface of the second top-layer electrode 301 or a surface of the first top-layer electrode 234. And the second top-layer electrode 301 is bonded to the first top-layer electrode 234.

Figure 26:
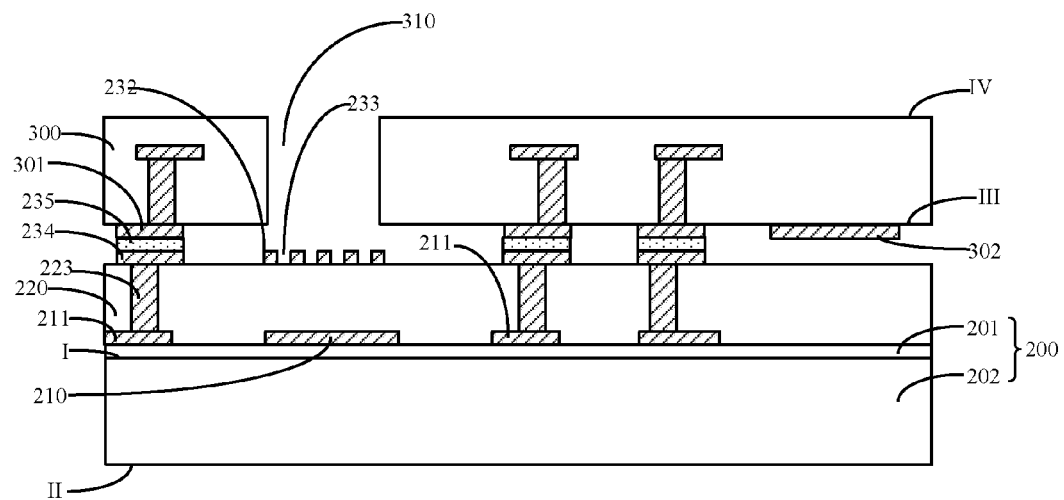

Referring to FIG. 26, by carrying out step S610, a part of the second substrate 300 is removed from the fourth surface IV to form a second opening 310 through which the fixed electrode is exposed.

Specifically, a photoresist layer (not shown) on the fourth surface IV is formed; the photoresist layer is exposed and developed so as to form a photoresist pattern corresponding to the second opening 310 within the photoresist layer; the second substrate 300 is etched by using the photoresist pattern as a mask, until the second opening 310 is formed, through which the fixed electrode is exposed.

Figure 27:
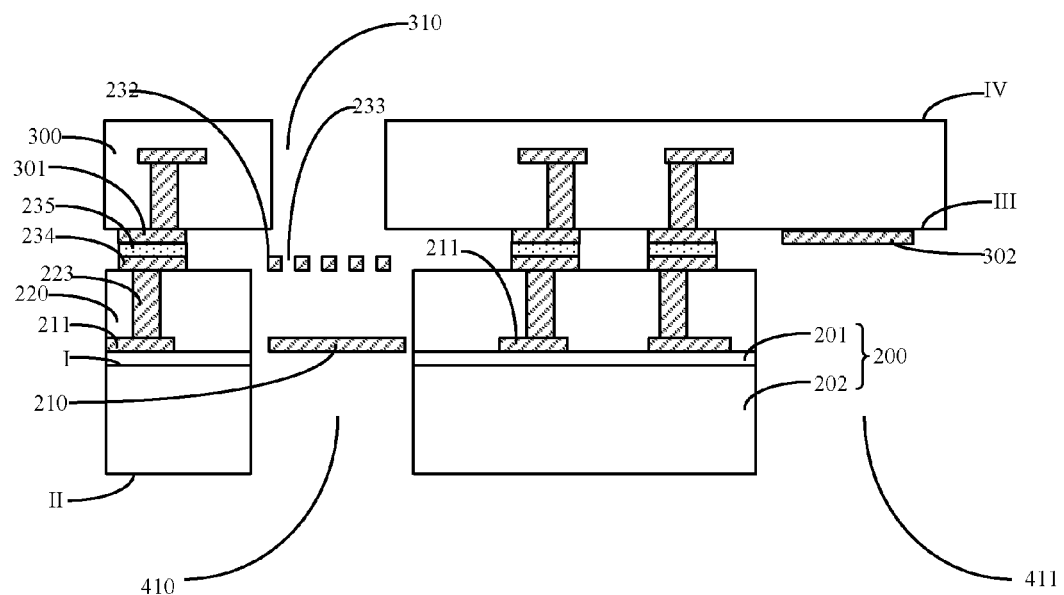

Referring to FIG. 27, by carrying out step S611, a part of the first substrate 200 is removed from the second surface II to form a first opening 410 which is in communication with the second opening 310, and a third opening 411 through which the bonding pad is exposed.

Specifically, a photoresist layer (not shown) on the second surface II is formed; the photoresist layer is exposed and developed so as to form, within the photoresist layer, a photoresist pattern corresponding to the first opening 410 and the third opening 411; and the first substrate 200 is etched by using the photoresist pattern as a mask, until the first opening 410 and the third opening 411 are formed, with the second opening 310 being in communication with the first opening 410, and the bonding pad 302 being exposed through the third opening 411.

It should be noted that because the first opening 410 has the same depth as the third opening 411 depending on a design of the MEMS microphone in this embodiment, the first opening 410 can be formed in the same etching process as the third opening 411. Thereby some process steps will be eliminated and production cost will be saved.

Referring to FIG. 27, the MEMS microphone formed by the method for forming the MEMS microphone according to the sixth embodiment includes:

a first substrate 200; a plurality of interconnects 211 formed on the first surface I of the first substrate 200; a dielectric layer 220 by which the plurality of interconnects 211 are covered; a conductive plug 223 located within the dielectric layer 220 and electrically coupled to the interconnect 211; a first top-layer electrode 234 located on a surface of the dielectric layer 220 and electrically coupled to the conductive plug 223; a bonding layer 235 located on a surface of the first top-layer electrode 234; a second top-layer electrode 301 located on a surface of the bonding layer 235 and corresponding to the first top-layer electrode 234; a bonding pad 302; a second substrate 300, within which a circuit is formed, located on a surface of the second top-layer electrode 301 and the bonding pad 302; an air cavity running through the first substrate 200 and the second substrate 300, with the air cavity being comprised of the first opening 410 and the second opening 310; a sensitive diaphragm 210 located within the air cavity and located in the same layer as the interconnect 211; a fixed electrode 232 located within the air cavity 320, corresponding to the sensitive diaphragm 210 and located in the same layer as the first top-layer electrode 234; a second through hole 233 running through the fixed electrode 232; and a third opening 411 formed within the first substrate 200 through which the bonding pad is exposed.

The MEMS microphone formed in the sixth embodiment of the present invention has the bonding pad formed on the surface of the second substrate 300, and the bonding pad is exposed through the third opening 411. And no additional step of forming the exposed bonding pad is needed in the subsequent packaging process, thereby some packaging process steps will be eliminated and production cost will be saved.

Seventh Embodiment

Figure 28:
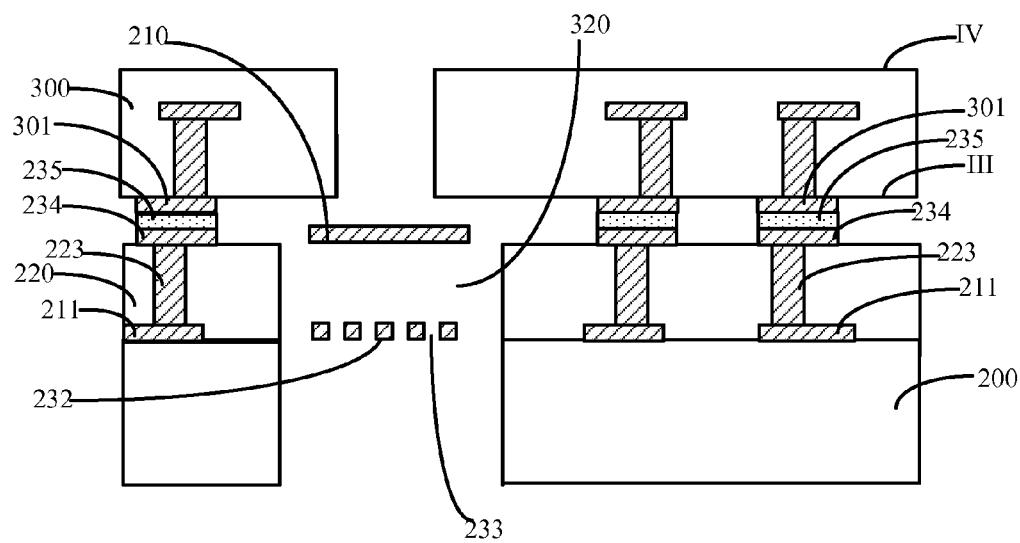
FIG. 28 is a schematic diagram of a MEMS microphone according to a seventh embodiment of the present invention.

Referring to FIG. 28, the MEMS microphone formed in the seventh embodiment of the present invention includes: a first substrate 200; a plurality of interconnects 211 formed on the first surface I of the first substrate 200; a dielectric layer 220 by which the plurality of interconnects 211 are covered; a conductive plug 223 located within the dielectric layer 220 and electrically coupled to the interconnect 211; a first top-layer electrode 234 located on a surface of the dielectric layer 220 and electrically coupled to the conductive plug 223; a bonding layer 235 located on a surface of the first top-layer electrode 234; a second top-layer electrode 301 located on a surface of the bonding layer 235 and corresponding to the first top-layer electrode 234; a second substrate 300, within which a circuit is formed, located on a surface of the second top-layer electrode 301; an air cavity 320 running through the first substrate 200 and the second substrate 300; a fixed electrode 232 located within the air cavity 320, and located in the same layer as the interconnect 211; a second through hole 233 running through the fixed electrode 232; and a sensitive diaphragm 210 located within the air cavity 320, corresponding to the fixed electrode 232 and located in the same layer as the first top-layer electrode 234.

The MEMS microphone formed in the seventh embodiment of the present invention has the same components as the MEMS microphone formed in the second embodiment, except that the positions of the fixed electrode 232 and the sensitive diaphragm 210 are exchanged. As for the forming method in this embodiment, reference may also be made correspondingly to the forming method in the second embodiment. However, steps of forming the fixed electrode 232 and forming the sensitive diaphragm 210 should be adjusted accordingly.

It should also be noted that as for the second embodiment, the third embodiment, the fourth embodiment, the fifth embodiment and the sixth embodiment, reference may also be made to the MEMS microphone formed in the seventh embodiment. In respective embodiments, the position of the fixed electrode 232 and the sensitive diaphragm 210 may be adjusted similarly without affecting the scope of the second embodiment, the third embodiment, the fourth embodiment, the fifth embodiment and the sixth embodiment.

Eighth Embodiment

Figure 29:
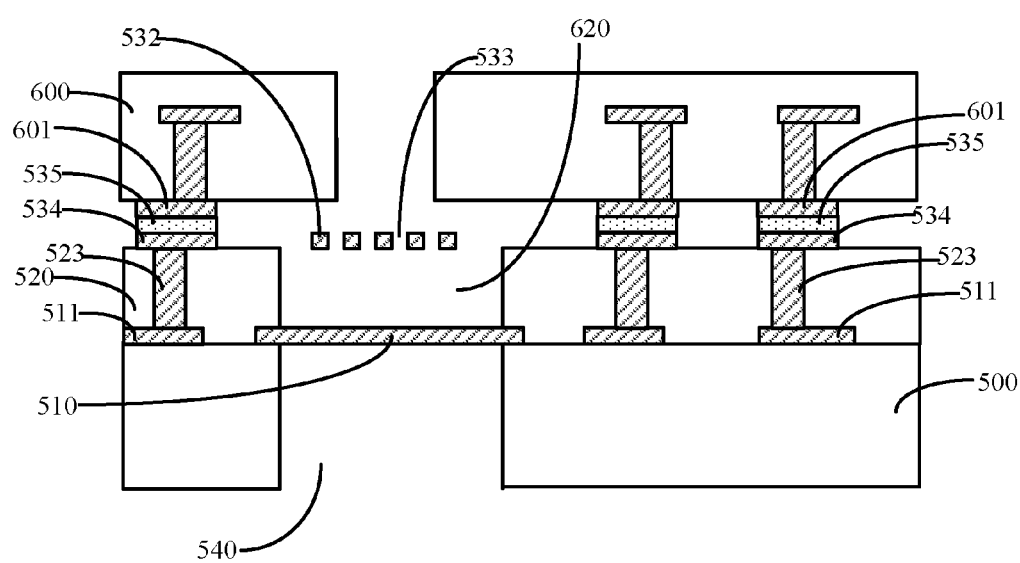
FIG. 29 is a schematic diagram of a MEMS microphone according to an eighth embodiment of the present invention.

Referring to FIG. 29, the MEMS microphone formed in the eighth embodiment of the present invention includes: a first substrate 500; a plurality of interconnects 511 and a sensitive diaphragm 510 formed on the first surface I of the first substrate 500; a dielectric layer 520 by which the plurality of interconnects 511 and a part of the sensitive diaphragm 510 are covered; a conductive plug 523 located within the dielectric layer 520 and electrically coupled to the interconnect 511; a first top-layer electrode 534 located on a surface of the dielectric layer 520 and electrically coupled to the conductive plug 523; a bonding layer 535 located on a surface of the first top-layer electrode 534; a second top-layer electrode 601 located on a surface of the bonding layer 535 and corresponding to the first top-layer electrode 534; a second substrate 600, within which a circuit is formed, located on a surface of the second top-layer electrode 601; an air cavity 620, through which the sensitive diaphragm 510 is exposed, running through the second substrate 600; a fixed electrode 532 located within the air cavity 620, corresponding to the sensitive diaphragm 510 and located in the same layer as the first top-layer electrode 534; a second through hole 533 running through the fixed electrode 532; and a first opening 540 located within the first substrate 500, through which the sensitive diaphragm 510 is exposed.

It should also be noted that as for the second embodiment, the third embodiment, the fourth embodiment, the fifth embodiment, the sixth embodiment and the seventh embodiment, reference may also be made to the MEMS microphone formed in the eighth embodiment. In respective embodiments, the design and the position of the sensitive diaphragm may be adjusted similarly without affecting the scope of the second embodiment, the third embodiment, the fourth embodiment, the fifth embodiment, the sixth embodiment and the seventh embodiment.

Although preferred embodiments of the present invention have been disclosed above, they are not intended to limit the present invention. Any possible variations and modifications can be made to the technical solution of the present invention by those skilled in the art according to the above-disclosed methods and technical contents without departing from the spirit and scope of the present invention. Therefore, any content which does not deviate from the technical solution of the present invention, and any modifications and equivalent variations made to the above embodiments according to the technical essence of the present invention will fall within the scope of protection of technical solution of the present invention.

The invention claimed is:

1. A MEMS microphone, comprising:
a first semiconductor substrate comprising a first surface and a second surface opposite to the first surface;
a MEMS sensitive diaphragm made of part of one or more layers on the first surface;
a first bonding structure made of part of the one or more layers on the first surface;
a second semiconductor substrate comprising a third surface and a fourth surface opposite to the third surface;
a circuit in the second semiconductor substrate;
a second bonding structure made of part of one or more layers deposited on the third surface;
wherein the first surface of the first semiconductor substrate is arranged opposite to the third surface of the second semiconductor substrate, and the circuit is electrically coupled to the MEMS sensitive diaphragm through bonding the first bonding structure and the second bonding structure.

2. The MEMS microphone according to claim 1, further comprising a fixed electrode corresponding to the sensitive diaphragm, wherein the fixed electrode is made of part of the one or more layers on the first surface.

3. The MEMS microphone according to claim 2, further comprising: a first structure located in the first semiconductor substrate, wherein the first structure is a first opening or a first air cavity.

4. The MEMS microphone according to claim 3, wherein the sensitive diaphragm or the fixed electrode is exposed through the first opening.

5. The MEMS microphone according to claim 2, further comprising: a second structure located in the second substrate, wherein the second structure is a second opening or a second air cavity.

6. The MEMS microphone according to claim 5, wherein the sensitive diaphragm or the fixed electrode is exposed through the second opening.

7. The MEMS microphone according to claim 5, wherein the first structure is in communication with the second structure.

8. The MEMS microphone according to claim 2, wherein the first bonding structure comprises a first top-layer electrode and a bonding layer located on a surface of the first top-layer electrode; wherein the first top-layer electrode is located in the same layer as the fixed electrode or the sensitive diaphragm, and is made from the same material as the fixed electrode or the sensitive diaphragm.

9. The MEMS microphone according to claim 1, further comprising: a bonding pad located on the first bonding surface and a third opening through which the bonding pad located on the first bonding surface is exposed.

10. The MEMS microphone according to claim 1, further comprising: a bonding pad located on the second bonding surface and a fourth opening through which the bonding pad located on the second bonding surface is exposed.

11. The MEMS microphone according to claim 2, wherein a travel stopper which is adapted to prevent stiction between the sensitive diaphragm and the fixed electrode, is formed on the first surface of the first semiconductor substrate.

12. A method for forming a MEMS microphone, comprising:
   providing a first semiconductor substrate comprising a first surface and a second surface opposite to the first surface;
   forming a MEMS sensitive diaphragm by using part of one or more layers on the first surface;
   forming a first bonding structure by using part of the one or more layers on the first surface;
   providing a second semiconductor substrate comprising a third surface and a fourth surface opposite to the third surface;
   forming a circuit in the second semiconductor substrate;
   forming a second bonding structure by using part of one or more layers deposited on the third surface;
   arranging the first surface of the first semiconductor substrate opposite to the third surface of the second semiconductor substrate; and
   bounding the first bonding structure and the second bonding structure together to form electrical coupling between the circuit and the MEMS sensitive diaphragm.

13. The method for forming the MEMS microphone according to claim 12, further comprising: forming a fixed electrode corresponding to the sensitive diaphragm by using part of the one or more layers deposited on the first surface.

14. The method for forming the MEMS microphone according to claim 13, further comprising: forming a first structure located in the first semiconductor substrate, wherein the first structure is a first opening or a first air cavity.

15. The method for forming the MEMS microphone according to claim 13, further comprising: forming a second structure located in the second substrate, wherein the second structure is a second opening or a second air cavity.

16. The method for forming the MEMS microphone according to claim 15, further comprising: communicating the first structure with the second structure.

17. The method for forming the MEMS microphone according to claim 12, further comprising: forming a bonding pad on the second bonding surface of the second substrate; and forming a fourth opening through which the bonding pad located on the second bonding surface is exposed.

18. The method for forming the MEMS microphone according to claim 13, wherein the first bonding structure comprises a first top-layer electrode and a bonding layer located on a surface of the first top-layer electrode; and the first top-layer electrode is formed in the same process step as the fixed electrode or the sensitive diaphragm.

19. The MEMS microphone according to claim 1, wherein the circuit is structured to provide a drive bias or a signal processing for the MEMS microphone.

20. The method for forming the MEMS microphone according to claim 12, wherein the circuit is structured to provide a drive bias or a signal processing for the MEMS microphone.

* * * * *